United States Patent
Soeta

(10) Patent No.: US 7,329,129 B2
(45) Date of Patent: Feb. 12, 2008

(54) TEST APPARATUS AND METHOD

(75) Inventor: Kaoru Soeta, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/378,946

(22) Filed: Mar. 17, 2006

(65) Prior Publication Data

US 2006/0211277 A1    Sep. 21, 2006

(30) Foreign Application Priority Data

Mar. 18, 2005   (JP)   ............................ 2005-079918
Aug. 9, 2005    (JP)   ............................ 2005-230349

(51) Int. Cl.
*H01R 12/00* (2006.01)

(52) U.S. Cl. .......................... 439/66; 439/71

(58) Field of Classification Search .................. 439/66, 439/71, 73, 67, 331; 324/754, 755, 158.1
See application file for complete search history.

(56) References Cited

U.S. PATENT DOCUMENTS

| | | | | |
|---|---|---|---|---|
| 6,439,897 B1 * | 8/2002 | Ikeya | ......................... | 439/73 |
| 6,541,991 B1 * | 4/2003 | Hornchek et al. | .......... | 324/755 |
| 6,590,159 B2 * | 7/2003 | Fan et al. | .................... | 174/541 |
| 6,636,057 B1 * | 10/2003 | Uchikura | ..................... | 324/754 |
| 6,798,228 B2 * | 9/2004 | Cuevas | ........................ | 324/755 |
| 6,821,129 B2 * | 11/2004 | Tsuchiya | ..................... | 439/66 |
| 6,958,616 B1 * | 10/2005 | Mahoney et al. | ............. | 324/754 |
| 6,991,473 B1 * | 1/2006 | Balcome et al. | .............. | 439/67 |
| 7,025,600 B2 * | 4/2006 | Higashi | ........................ | 439/66 |

FOREIGN PATENT DOCUMENTS

| | | |
|---|---|---|
| JP | 2002-357622 | 9/1997 |
| JP | H09-232057 | 9/1997 |

* cited by examiner

*Primary Examiner*—Hien Vu
(74) *Attorney, Agent, or Firm*—Brinks Hofer Gilson & Lione

(57) ABSTRACT

An upper side and a lower side of a coupling member are provided with spiral contacts including elastic deforming portions. The elastic deforming portions are made contact with connectors of an IC package. Thereby, contact pressure on the IC package can be reduced. Further, the coupling member is replaceably positioned with respect to a substrate. Accordingly, only the coupling member can be replaced as needed, and therefore, maintenance fee can be reduced.

7 Claims, 18 Drawing Sheets

TEST APPARATUS AND METHOD

BACKGROUND OF THE INVENTION

1. Field of the Invention

The present invention relates to a test apparatus for use in a burn-in test, for example, and more particularly to a test apparatus and method capable of reducing contact pressure with respect to a test object (e.g., an IC package) and allowing easy replacement of only a coupling member of the apparatus.

2. Description of the Related Art

A multitude of IC packages are manufactured from a wafer and are individually separated. Thereafter, the individual IC packages are subjected to the burn-in test. The burn-in test is performed to determine whether or not each IC package is free of a cut in wiring or the like even under a predetermined high-temperature accelerating condition and thus is qualified for a final operation test.

Conventionally, as illustrated in FIG. 26, the burn-in test is performed by placing the individual IC packages 3 in a multitude of IC sockets 2 formed in a burn-in board 1. For example, as illustrated in FIG. 27, each IC socket 2 includes a recess 4 for accommodating the individual IC package 3, and covers 5 for applying biasing force toward the inside of the recess 4 to press the IC package 3 set in the recess 4 into the recess 4. As illustrated in FIG. 27, a bottom surface of the recess 4 is provided with a multitude of contact pins 6 which contact connecting terminals 3a, such as BGAs, of the IC package 3 to be in conductive contact with and connected thereto.

Examples of conventional IC sockets are described in Japanese Unexamined Patent Application Publication No. 9-232057 and Japanese Unexamined Patent Application Publication No. 2002-357622, for example.

As described above, the IC socket 2 is formed for the individual IC package 3 on the conventional burn-in board 1. Due to a structural restriction that the IC socket 2 accommodates and presses the IC package 3 thereinto, there is a limit in downsizing the IC socket 2. Thus, it is difficult to increase the number of the IC sockets 2 formed on the burn-in board 1 of a predetermined size. Therefore, to perform the burn-in test at one time on the IC packages 3 of a larger number than previously, structures of a conventional test apparatus and the conventional burn-in board need to be improved.

Further, each of the contact pins 6 provided in the IC socket 2 applies high contact pressure to the corresponding connecting terminal 3a of the IC package 3. Therefore, to securely hold the IC package 3 within the IC socket 2, a pressing mechanism (e.g., the covers 5 shown in FIG. 27) tends to have a complex structure. Furthermore, it is difficult to evenly apply the contact pressure to all of the contacting terminals 3a. Also, the high contact pressure damages the contacting terminals 3a in some cases.

In addition, when one of the contact pins 6 fails to operate properly, replacement of only the failed contact pin 6 is not allowed. That is, the entire burn-in board 1 including the failed contact pin 6 needs to be replaced. As a result, maintenance fee is increased.

SUMMARY OF THE INVENTION

In light of the above circumstances, it is an object of the present invention to provide a test apparatus and method capable of reducing the contact pressure with respect to a test object and allowing, where necessary, easy replacement of only a coupling member of the apparatus.

A test apparatus according to one aspect of the present invention includes a coupling member including a base plate, terminals provided on a front surface and a back surface of the base plate and having elastic deforming portions, and conducting portions formed in the base plate for providing conductive contact between the terminals on the front surface and the terminals on the back surface. The test apparatus further includes a substrate formed with a recess for accommodating a test object and the coupling member, a plurality of electrodes provided on a bottom surface of the recess, a positioning portion for replaceably positioning the coupling member with respect to the substrate while keeping the terminals on the back surface of the base plate in contact with the plurality of electrodes, and a pressing portion for pressing the test object set in the recess against the coupling member while keeping electrodes of the test object in contact with the terminals on the front surface of the coupling member.

In the test apparatus according to the one aspect of the present invention, an upper side and a lower side of the coupling member are provided with the terminals including the elastic deforming portions. The elastic deforming portions are made contact with electrodes of the test object. Thereby, contact pressure on the test object can be reduced. Further, the coupling member is replaceably positioned with respect to a substrate. Accordingly, only the coupling member can be easily replaced as needed, and therefore, maintenance fee can be reduced.

Preferably, in the test apparatus according to the one aspect of the present invention, the recess may be capable of accommodating a test object assembly including a plurality of the test objects connected with one another. Accordingly, the plurality of the test objects can be tested at one time. Further, due to the reduced contact pressure, contact pressure of a predetermined level can be applied to the all of the test objects, and the electrodes of the test objects can be prevented from being damaged.

Further, preferably, in the test apparatus according to the one aspect of the present invention, the recess may be capable of accommodating a plurality of the test object assemblies. This is preferable since a large number of the test objects can be tested at one time.

Further, in the test apparatus according to the one aspect of the present invention, the pressing portion may be capable of pressing a plurality of the test objects placed in the same recess at one time. Accordingly, the respective test objects can be easily pressed, and pressing force applied to the respective test objects can be kept at a constant level.

Further, in the test apparatus according to the one aspect of the present invention, a plurality of the coupling members may be placed in the same recess, or at least one of the plurality of the coupling members may be placed in the individual recess. Further, each of the coupling members may be replaceably positioned with respect to the substrate. Accordingly, the test apparatus can reduce costs required for replacement of the coupling member.

Further, in the test apparatus according to the one aspect of the present invention, the positioning portion may include a communicating portion formed in the coupling member for enabling the front surface and the back surface of the coupling member to communicate with each other, and a piercing member for piercing through the communicating portion. This is preferably since the coupling member can be easily and appropriately positioned on the substrate.

Further, preferably, in the test apparatus according to the one aspect of the present invention, the piercing member may be provided on the substrate, and the coupling member may be positioned and placed on the substrate, with the piercing member piercing through the communicating portion. In the test apparatus according to the one aspect of the present invention, the pressing portion presses the test object toward the coupling member. Therefore, during a test, the coupling member is sandwiched and held by the test object and the substrate with pressing forces. This prevents, in particular during the test, such phenomena as misalignment of the coupling member in the recess and cutoff of conduction between the terminals, the connectors, and the electrodes. Further, the coupling member can be easily attached to the substrate only by placing it thereon, with no particular need to fix it thereon.

Further, preferably, in the test apparatus according to the one aspect of the present invention, the substrate may include a retaining portion for preventing the coupling member from escaping from the recess. Accordingly, even if the coupling member is not fixed on the substrate, the coupling member can be prevented from escaping from the recess before placement of the test object in the recess.

Further, in the test apparatus according to the one aspect of the present invention, the positioning portion may serve as a fixing portion for fixing the coupling member on the substrate. For example, it is preferable that the coupling member is positioned with respect to the substrate and fixed thereon by a screw, since the coupling member can be positioned and fixed on the substrate by a simple technique.

Further, in the test apparatus according to the one aspect of the present invention, the coupling member may include a holding space used in removing the coupling member from the recess. This is preferable since the coupling member can be easily removed from the recess.

Further, preferably, in the test apparatus according to the one aspect of the present invention, the elastic deforming portions may be formed three-dimensionally to extend in a direction away from the base plate. Accordingly, the elastic deforming portions can be appropriately made contact with the electrodes of the test object and the electrodes of the substrate.

Further, preferably, in the test apparatus according to the one aspect of the present invention, a plurality of the elastic deforming portions may be formed on at least one surface of the base plate, and the elastic deforming portions may have different heights. For example, if the height of the elastic deforming portions is changed in accordance with the degree of bend of the coupling member when it is attached to the substrate, the elastic deforming portions can be securely made contact with the electrodes of the test object and the electrodes of the substrate.

A test method according to one aspect of the present invention uses the above-described test apparatus according to the one aspect of the present invention. The test apparatus includes the steps of (a) accommodating the test object in the recess of the substrate, (b) causing the pressing portion to press the test object against the coupling member, and (c) performing a predetermined test on the test object.

Accordingly, the contact pressure on the test object can be reduced, and a test can be appropriately performed.

Preferably, in the test method according to the one aspect of the present invention, the recess may be capable of accommodating a test object assembly including a plurality of the test objects connected with one another, and the predetermined test may be performed on the plurality of the test objects at one time. Accordingly, the test can be effectively performed.

According to the test apparatuses and methods of the above aspects of the present invention, the contact pressure with respect to the test object can be reduced. Further, only the coupling member of the apparatus can be easily replaced, and thus maintenance fee can be reduced.

DESCRIPTION OF THE PREFERRED EMBODIMENTS

Figure 1:
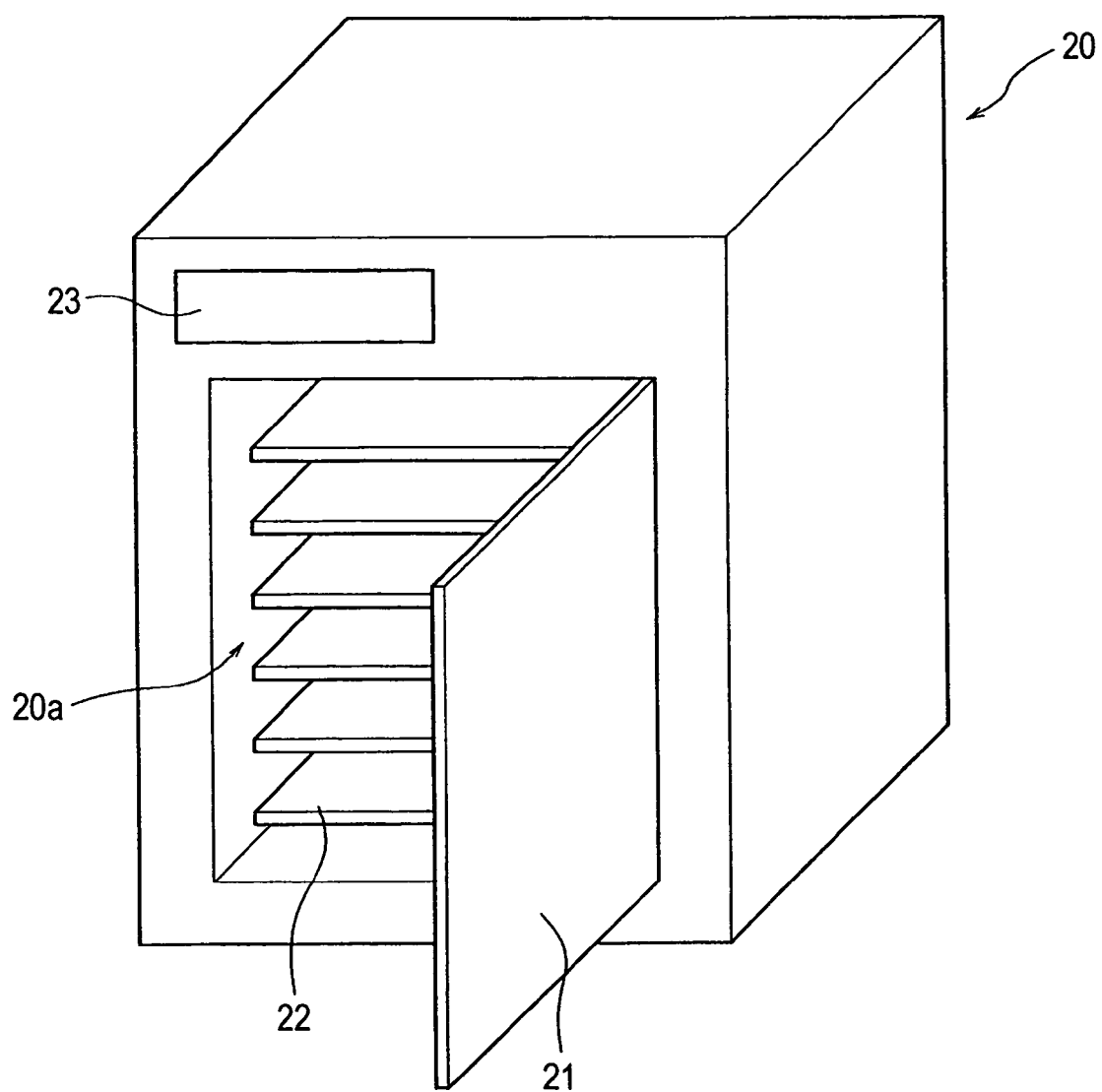
FIG. 1 is a partial perspective view of a burn-in test apparatus.
Figure 2:
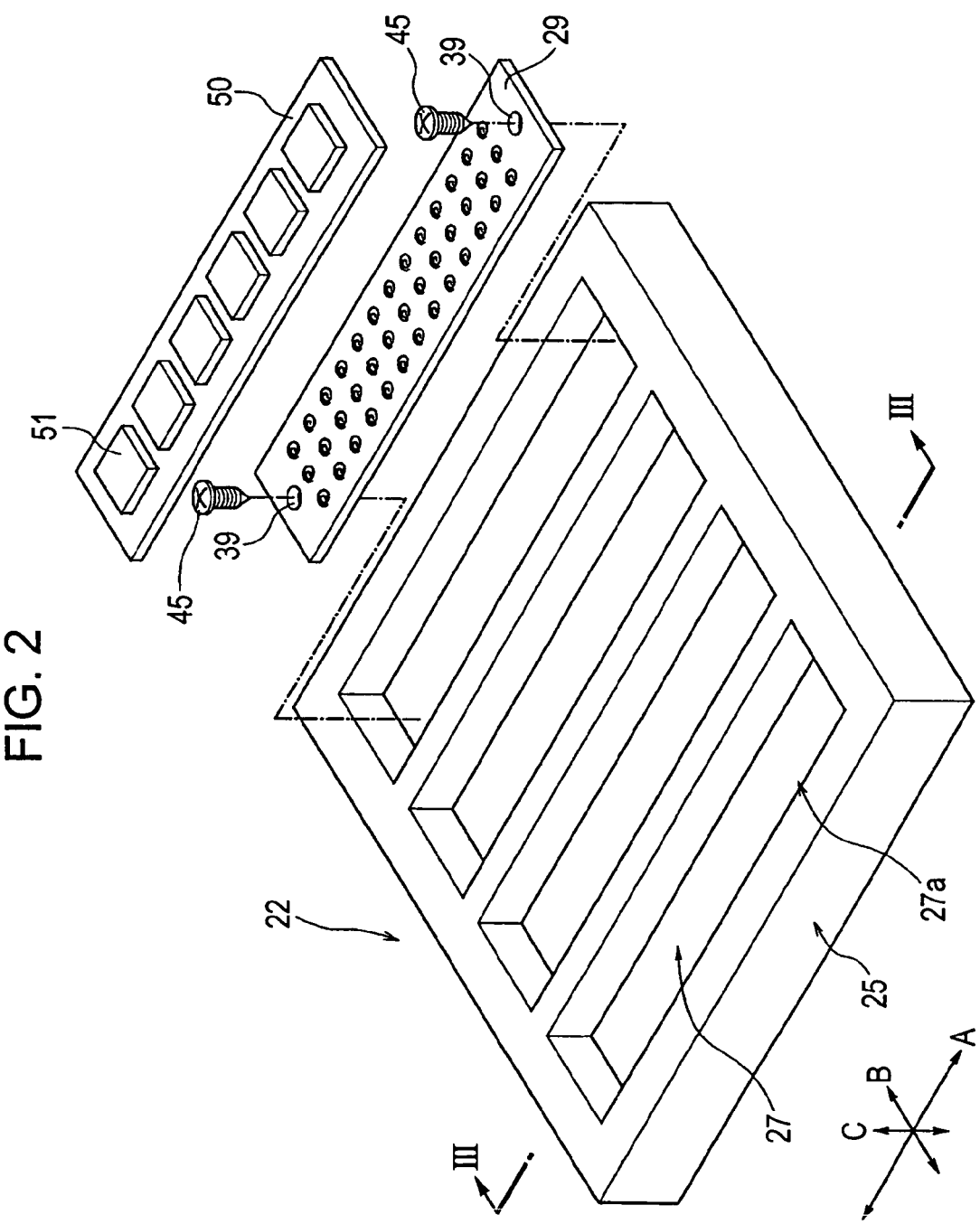
FIG. 2 is a partial perspective view of a burn-in board according to an embodiment of the present invention included in the burn-in test apparatus.
Figure 3:
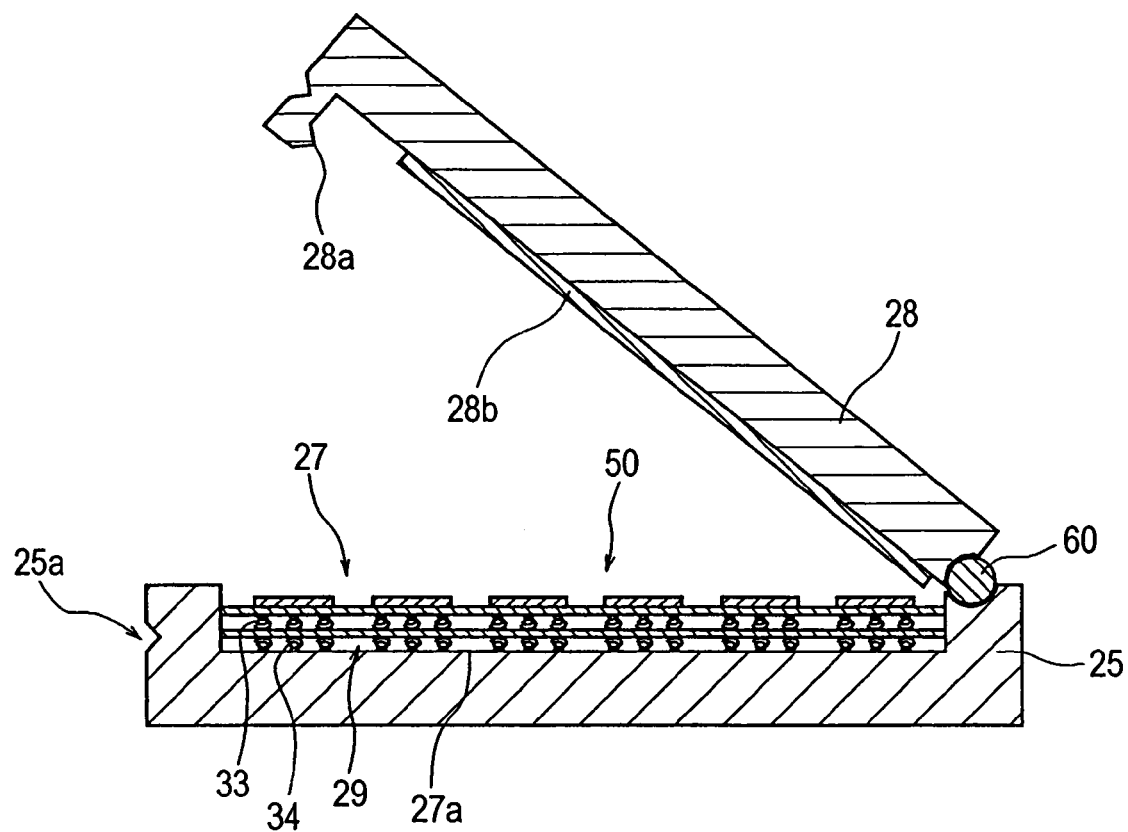
FIG. 3 is a partial cross-sectional view of the burn-in board shown in FIG. 2 cut along the line III-III, as viewed in the direction of arrows placed near the line.
Figure 4:
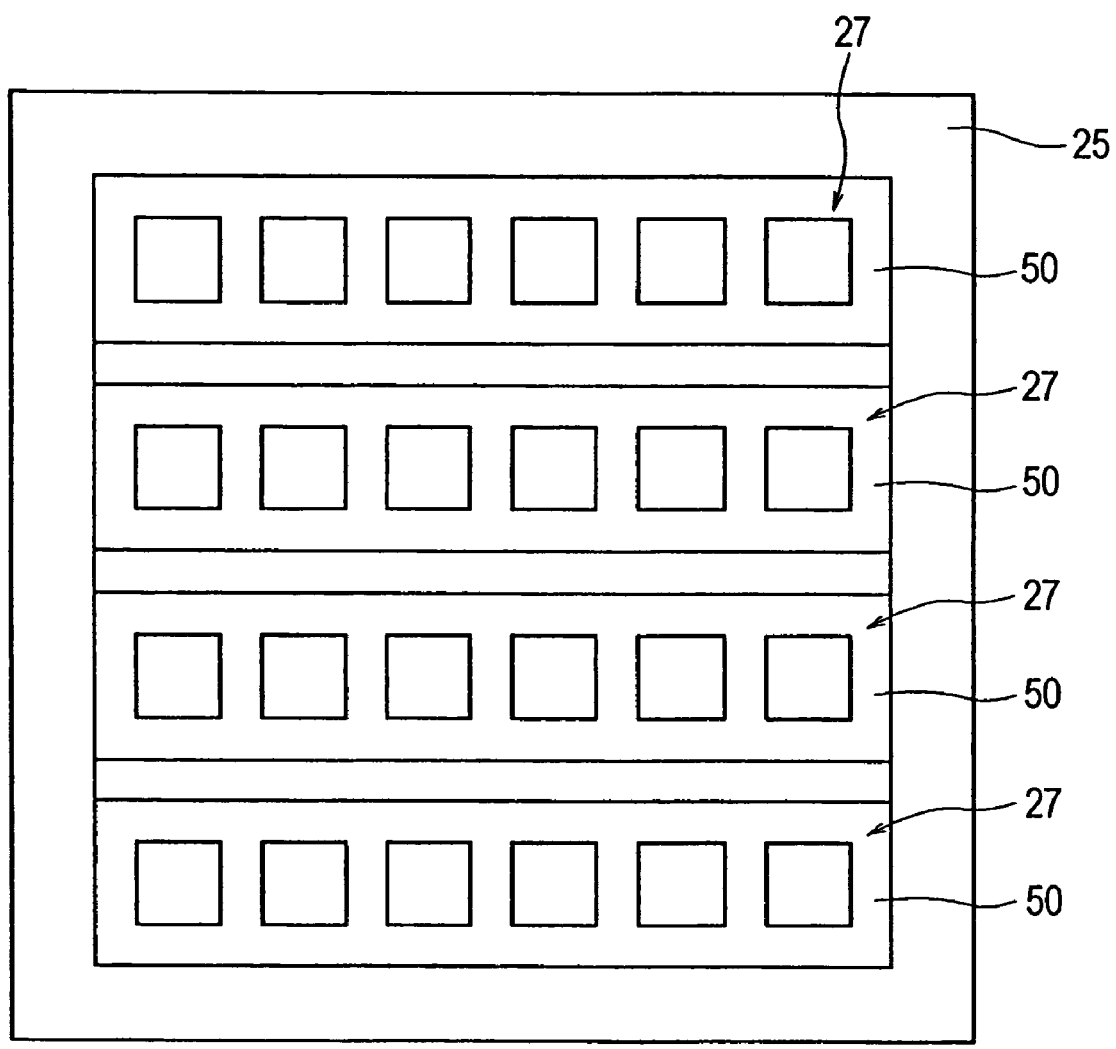
FIG. 4 is a partial plan view of IC package assemblies placed on mounting surfaces of the burn-in board shown in FIG. 2.
Figure 5:
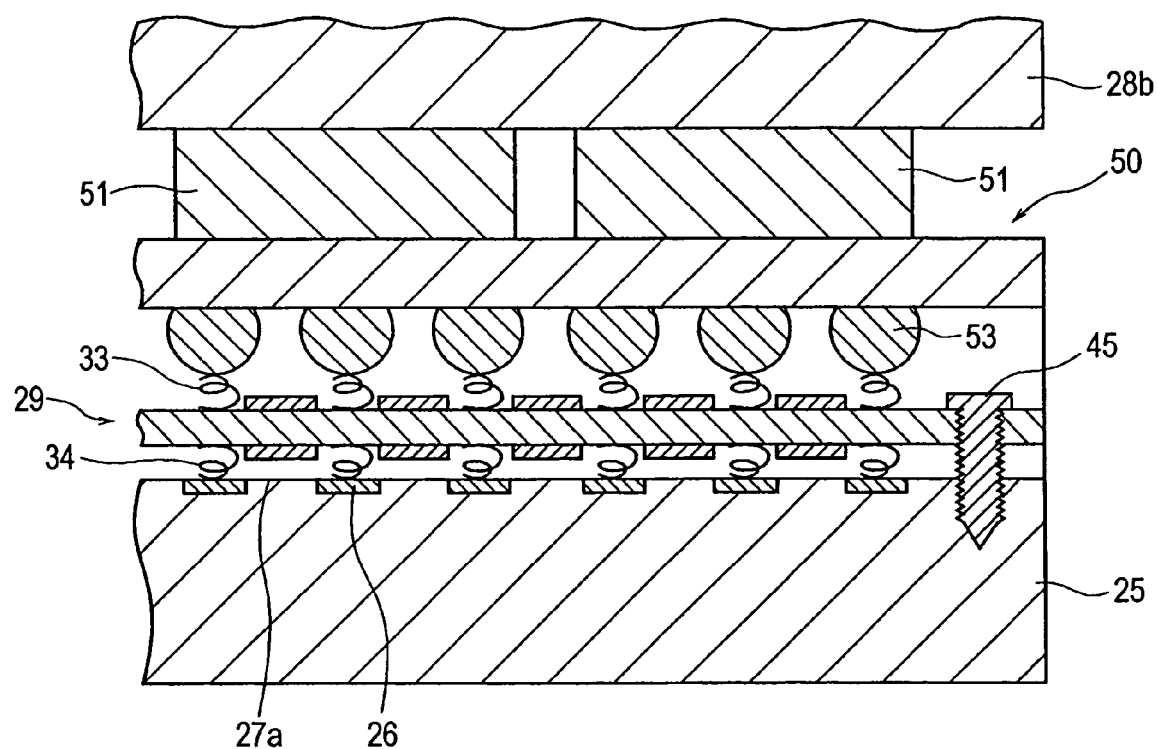
FIG. 5 is a partial enlarged cross-sectional view of a part of the burn-in board shown in FIG. 3.
Figure 6:
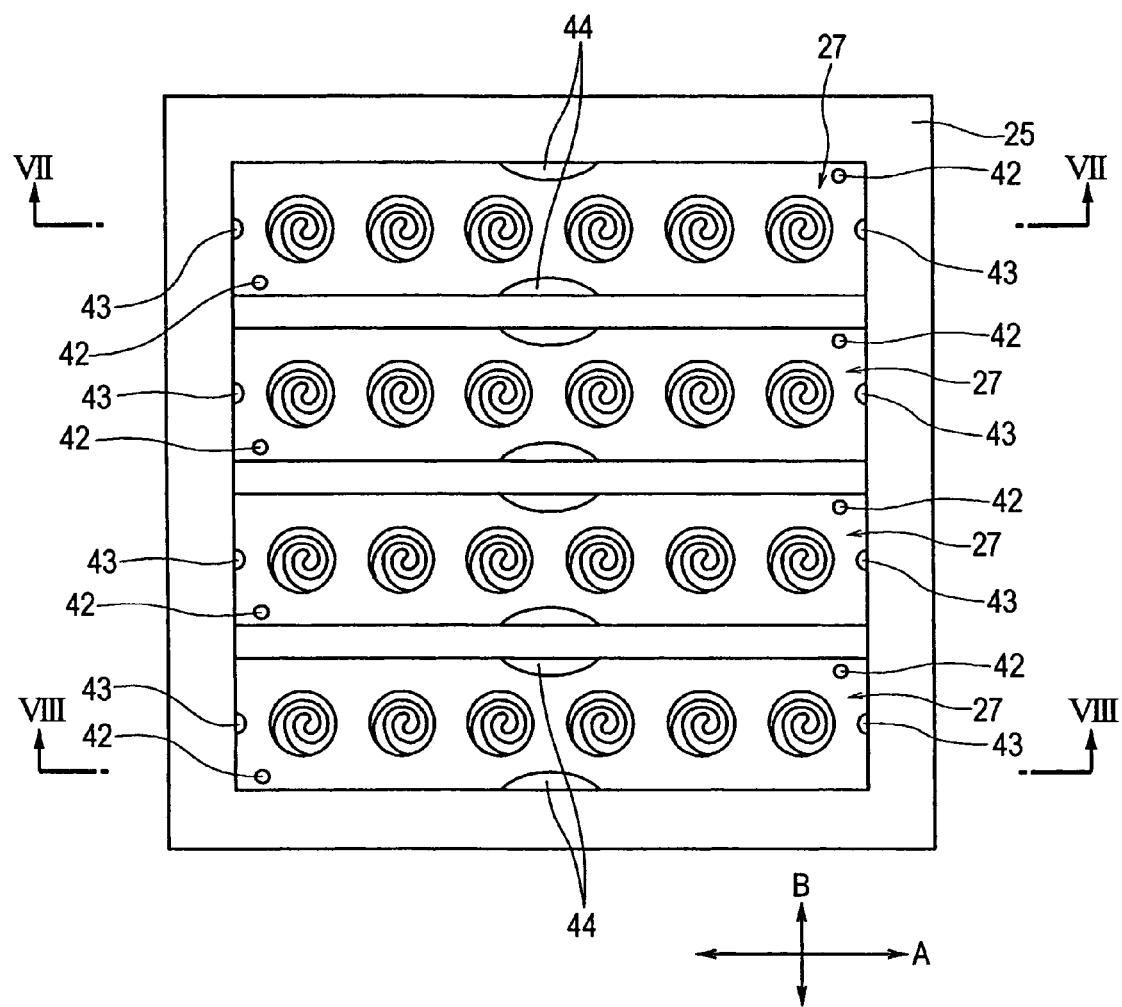
FIG. 6 is a partial plan view of a burn-in board having a different structure from the structure of the burn-in board shown in FIGS. 2 to 5.
Figure 7:
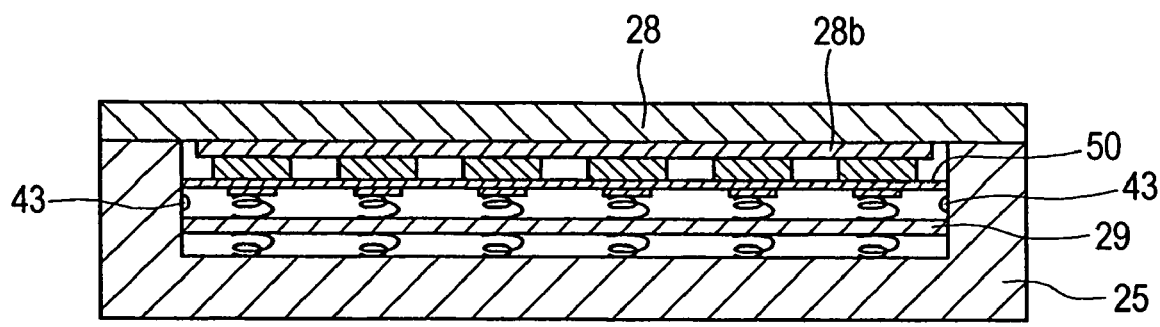
FIG. 7 is a partial cross-sectional view of the burn-in board shown in FIG. 6 carrying thereon the IC package assemblies cut along the line VII-VII in a thickness direction, as viewed in the direction of arrows placed near the line.
Figure 8:
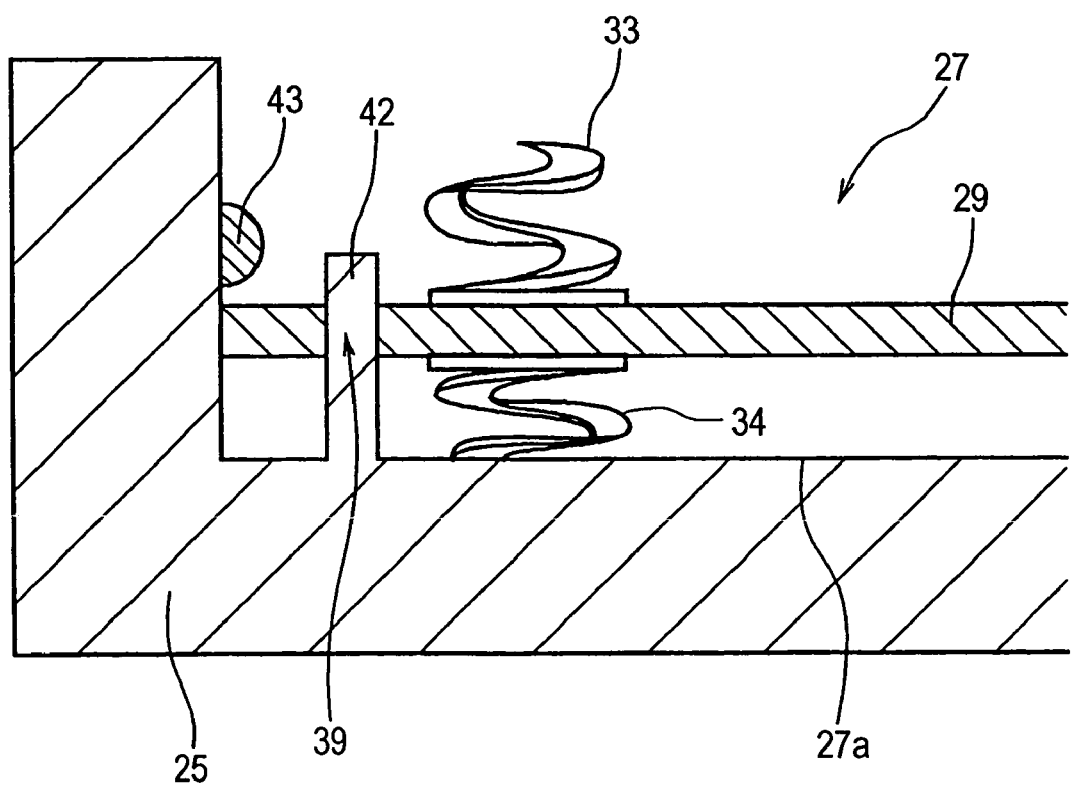
FIG. 8 is a partial enlarged cross-sectional view of the burn-in board shown in FIG. 6 cut along the line VIII-VIII in the thickness direction, as viewed in the direction of arrows placed near the line.
Figure 9:
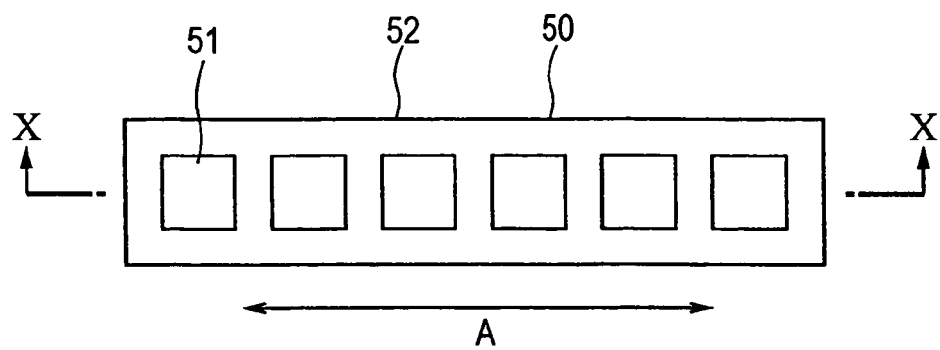
FIG. 9 is a plan view of the IC package assembly.
Figure 10:
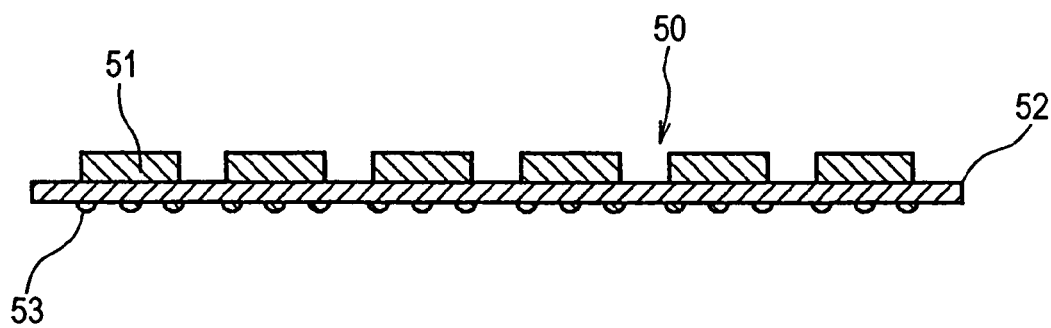
FIG. 10 is a partial cross-sectional view of the IC package assembly shown in FIG. 9 cut along the line X-X, as viewed in the direction of arrows placed near the line.
Figure 11:
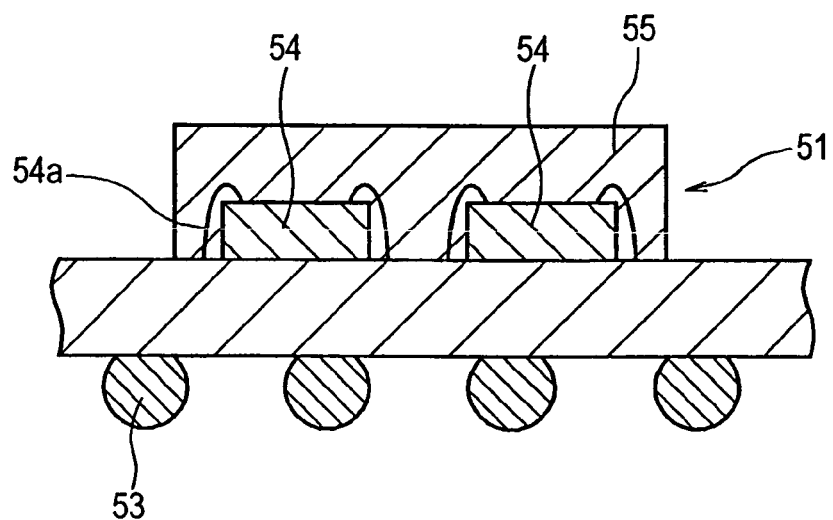
FIG. 11 is a partial enlarged cross-sectional view of the IC package assembly for showing an enlarged view of an IC package.
Figure 12:
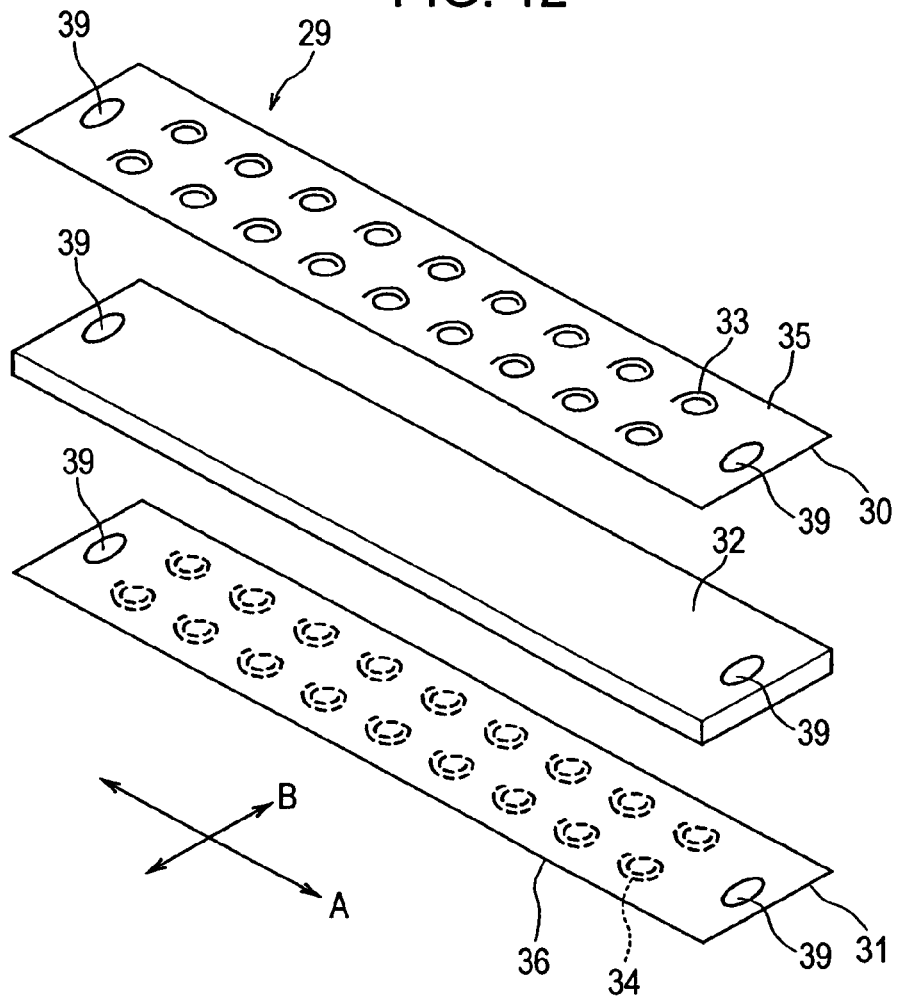
FIG. 12 is an exploded perspective view of a coupling member according to an embodiment of the present invention.
Figure 13:
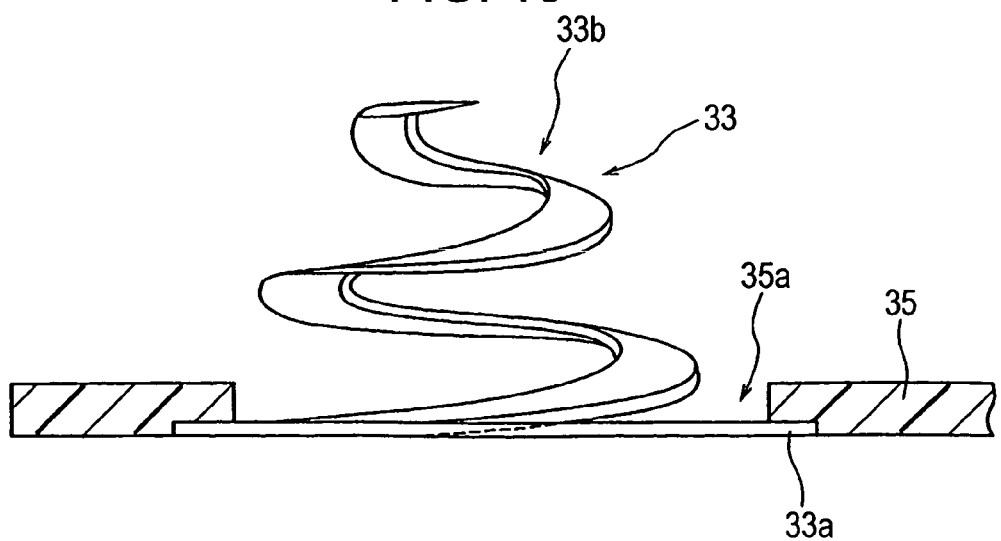
FIG. 13 is an enlarged side view of a contact for illustrating an overall structure of the contact.
Figure 14:
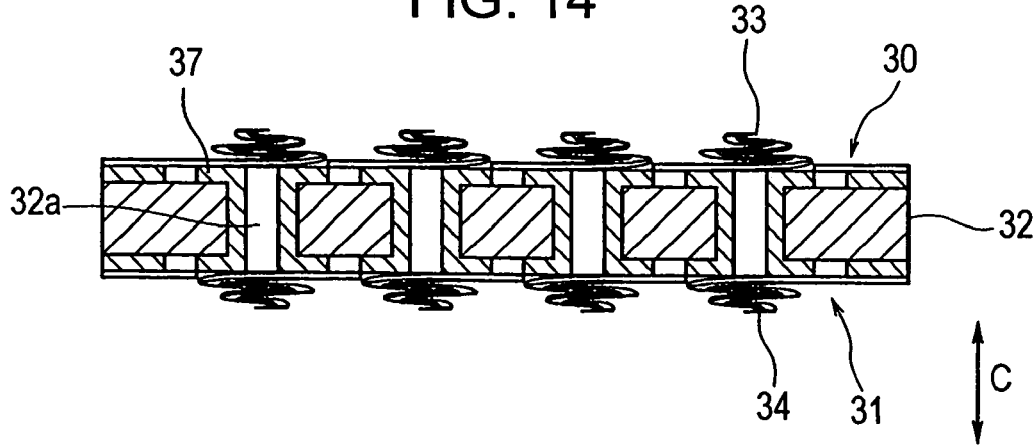
FIG. 14 is a partial cross-sectional view of the coupling member shown in FIG. 12.
Figure 15:
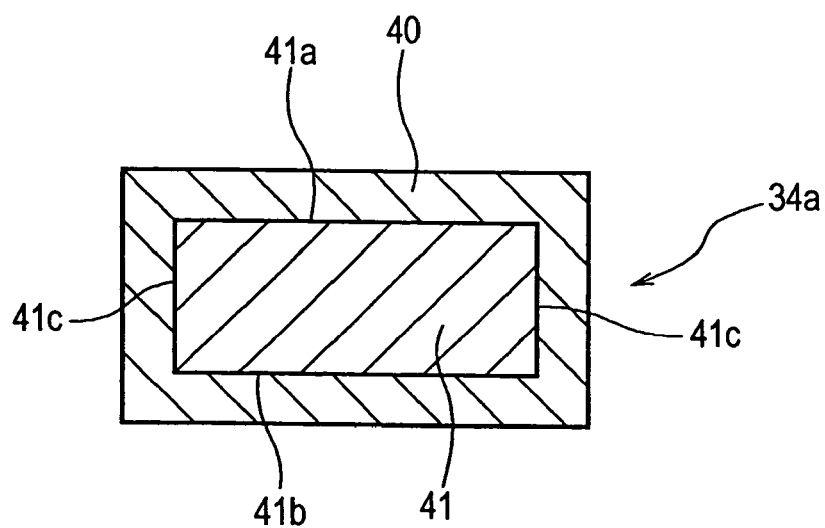
FIG. 15 is a partial enlarged cross-sectional view of the contact for illustrating the structure of a cut surface of the contact.

FIG. 1 is a partial perspective view of a burn-in test apparatus. FIG. 2 is a partial perspective view of a burn-in board according to an embodiment of the present invention included in the burn-in test apparatus. FIG. 3 is a partial cross-sectional view of the burn-in board shown in FIG. 2 cut along the line III-III in the thickness direction, as viewed in the direction of arrows placed near the line. FIG. 4 is a partial plan view of IC package assemblies placed on mounting surfaces of the burn-in board shown in FIG. 2. FIG. 5 is a partial enlarged cross-sectional view of a part of the burn-in board shown in FIG. 3. FIG. 6 is a partial plan view of a burn-in board having a different structure from the structure of the burn-in board shown in FIGS. 2 to 5. FIG. 7 is a partial cross-sectional view of the burn-in board shown in FIG. 6 carrying thereon the IC package assemblies cut along the line VII-VII in the thickness direction, as viewed in the direction of arrows placed near the line. FIG. 8 is a partial enlarged cross-sectional view of the burn-in board shown in FIG. 6 cut along the line VIII-VIII in the thickness direction, as viewed in the direction of arrows placed near the line. FIG. 9 is a plan view of the IC package assembly. FIG. 10 is a partial cross-sectional view of the IC package assembly shown in FIG. 9 cut along the line X-X in the thickness direction, as viewed in the direction of arrows placed near the line. FIG. 11 is a partial enlarged cross-sectional view of the IC package assembly for showing an enlarged view of an IC package. FIG. 12 is an exploded perspective view of a coupling member according to the present embodiment. FIG. 13 is an enlarged side view of a terminal of the coupling member for illustrating an overall structure of the terminal. FIG. 14 is a partial cross-sectional view of the coupling member shown in FIG. 12 cut in the thickness direction. FIG. 15 is a partial enlarged cross-sectional view of the terminal cut in the thickness direction for illustrating the structure of a cut surface of the terminal.

The burn-in test apparatus 20 shown in FIG. 1 includes a door 21 formed on a front side thereof, a heating furnace 20a provided behind the door 21. The heating furnace 20a accommodates a multitude of burn-in boards (i.e., supporting members) 22. The front surface of the burn-in test apparatus 20 is provided with an operation unit 23 including a thermometer, a monitor, a variety of buttons, and the like.

Each of the burn-in boards 22 provided in the burn-in test apparatus 20 can be pulled out toward the front side in FIG. 1. On the burn-in board 22 thus pulled out, IC package assemblies 50 (later described) are placed and accommodated.

As illustrated in FIGS. 2 and 3, the burn-in board 22 includes a substrate 25, a cover 28, and a coupling member 29. The substrate 25 is formed by layering a multitude of printed wiring boards (PWBs).

As illustrated in FIGS. 2 and 4, an upper surface of the substrate 25 is formed with a plurality of recesses 27. The recesses 27 are each elongated in a width direction of the burn-in board 22 (i.e., directions A shown in the figure), and is formed into an approximately rectangular shape as viewed from directly above. The plurality of recesses 27 are provided at predetermined intervals in a length direction of the burn-in board 22 (i.e., directions B shown in the figure). The recesses 27 each include a bottom surface and side surfaces which surround four sides. The bottom surface of each of the recesses 27 forms a mounting surface 27a for receiving the IC package assembly 50.

As illustrated in FIG. 5, on the mounting surface 27a (i.e., the bottom surface of the recess 27), parts of a wiring pattern of the upper most one of the PWBs are exposed to form electrodes 26.

As illustrated in FIGS. 2 and 3, the recesses 27 each accommodate the coupling member 29 provided with a multitude of terminals. The coupling member 29 will now be described in detail. As illustrated in FIG. 12, the coupling member 29 includes an upper sheet 30, a lower sheet 31, and a base plate 32. The upper sheet 30 includes a multitude of upper spiral contacts (i.e., terminals) 33 and a resin sheet 35 for fixing and holding the upper spiral contacts 33. Meanwhile, the lower sheet 31 includes a multitude of lower spiral contacts (i.e., terminals) 34 and a resin sheet 36 for fixing and holding the lower spiral contacts 34. The upper and lower spiral contacts 33 and 34 are formed by electrocasting or by coating a surface of a foil member with a metal layer. As illustrated in FIG. 13, each of the spiral contacts 33 is formed three-dimensionally into a spiral shape. The resin sheet 35 is formed of a polyimide resin or the like, for example. As illustrated in FIG. 13, the resin sheet 35 is formed with a through hole 35a at a position facing an elastic deforming portion 33b of the upper spiral contact 33. As described above, FIG. 13 illustrates the upper spiral contact 33 provided on the upper sheet 30 and the resin sheet 35. Structures of the lower spiral contact 34 provided on the lower sheet 31 and the resin sheet 36 are similar to the structures of the upper spiral contact 33 and the resin sheet 35 shown in FIG. 13 (the lower spiral contact 34 provided on the lower sheet 31 are formed three-dimensionally to protrude downward).

As illustrated in FIG. 14, the base plate 32 is formed with through holes 32a at positions facing the upper spiral contacts 33 and the lower spiral contacts 34 in the thickness direction (i.e., directions C shown in the figure). A conducting portion 37 is formed by a sputtering technique or the like around a periphery of each of the through holes 32a. The conducting portion 37 extends to parts of the upper and lower surfaces of the base plate 32. However, adjacent conducting portions 37 each extending from the inside of the corresponding through hole 32a to the parts of the upper and lower surfaces of the base plate 32 are not in conductive contact with each other. As illustrated in FIG. 14, the upper sheet 30 is adhered to the upper surface of the base plate 32 with an adhesive agent or the like. Similarly, the lower sheet 31 is adhered to the lower surface of the base plate 32 with the adhesive agent or the like. As illustrated in FIG. 14, the upper spiral contacts 33 and the lower spiral contacts 34 facing each other via the base plate 32 are in conductive contact with each other and connected to each other by the conducting portions 37 formed in the base plate 32.

As illustrated in FIGS. 2 and 12, opposite sides of the coupling member 29 in its width direction (i.e., the directions A shown in the figures) are formed with through holes (i.e., communicating portions) 39 in which screws (i.e., piercing members) 45 are inserted.

As illustrated in FIG. 13, the upper spiral contact 33 includes a fixed portion 33a fixed to the resin sheet 35, and the elastic deforming portion 33b upwardly protruding in a spiral manner from the fixed portion 33a. As illustrated in FIG. 15 which shows the cut surface of the elastic deforming portion 33b cut in its thickness direction, the elastic deforming portion 33b includes a supplemental elastic layer 41 and a conductive layer 40 which is formed over an upper surface 41a, a lower surface 41b, and opposite side surfaces 41c of the supplemental elastic layer 41 to surround the supplemental elastic layer 41. The conductive layer 40 is formed of a material having a smaller specific resistance value than a specific resistance value of the supplemental elastic layer 41. Meanwhile, the supplemental elastic layer 41 is formed of a material having a higher yield point and a higher elastic coefficient than a yield point and an elastic coefficient of the conductive layer 40. Thus configured, the elastic deforming portion 33b has both good elasticity and good conductivity. In the example shown in FIG. 15, the supplemental elastic layer 41 is plated with the conductive layer 40 by an electroless plating method, for example, such that the conductive layer 40 surrounds the supplemental elastic layer 41. The lower spiral contact 34 provided on the lower sheet 31 also has a cut surface similar to the cut surface shown in FIG. 15.

The conductive layer 40 is formed of a Cu alloy. Meanwhile, a material forming the supplemental elastic layer 41 is selected from Ni and Ni—X, wherein X includes at least one of P, W, Mn, Ti, and Be. The Cu alloy forming the conductive layer 40 is preferably a Corson alloy including Cu, Si, and Ni. The Corson alloy including Cu, Si, and Ni is a material having both high electric conductivity and high endurance and thus is suitable as a material forming the upper and lower spiral contacts 33 and 34.

The upper and lower spiral contacts 33 and 34 need not be all formed three-dimensionally to an equal height. The coupling member 29 tends to be bent when it is attached to the substrate 25. Therefore, for example, the height of the upper and lower spiral contacts 33 and 34 may be changed between a central region of the coupling member 29 and opposite end regions of the coupling member 29. If the opposite end regions of the coupling member 29 are bent upward when the coupling member 29 is attached to the substrate 25, for example, the height of the upper spiral contacts 33 may be set to be larger in the central region than in the opposite end regions of the coupling member 29. Conversely, the height of the lower spiral contacts 34 may be set to be smaller in the central region than in the opposite end regions of the coupling member 29. By so doing, conductive contact and connection are increasingly secured between the upper spiral contacts 33 and connectors (i.e., electrodes) 53 and between the lower spiral contacts 34 and the electrodes 26.

As illustrated in FIGS. 2 and 5, each of the through holes 39 formed in the coupling member 29 is aligned with a corresponding through hole formed on the substrate 25, and then the coupling member 29 is positioned and fixed on the mounting surface 27a of the corresponding recess 27 by the screw 45. In this case, as illustrated in FIG. 5, the electrodes 26 exposed on the mounting surface 27a come into contact with leading ends of the lower spiral contacts 34 provided on the lower sheet 31 of the coupling member 29. Thereby, the lower spiral contacts 34 are securely in conductive contact with and connected to the electrodes 26. The coupling member 29 is positioned and fixed on the substrate 25 by using the screws 45, with no particular need to use an adhesive agent or the like. Thus, if one of the coupling members 29 needs to be replaced, the coupling member 29 can be detached from the substrate 25 by unscrewing the screws 45. As the screws 45 are engaged with the through holes 39, the coupling member 29 is positioned on the substrate 25 and fixed in the recess 27.

Description will now be made of the IC package assembly (i.e., a test object assembly) 50 which is the test object of the burn-in test. As illustrated in FIG. 9, in the IC package assembly 50, a multitude of IC packages (i.e., test objects) 51 are connected to one another at predetermined intervals in the directions A shown in the figure by a connecting member 52 which is a lead frame or a film interposer. As illustrated in FIG. 10, a multitude of the connectors (i.e., electrodes) 53 are exposed on the lower surface of the connecting member 52. The connectors 53 may be BGAs, LGAs, or the like. As illustrated in FIG. 11, each of the IC packages 51 includes electronic function devices 54 including a plurality of IC chips (i.e., bare chips). The electronic function devices 54 are sealed with a molding resin 55.

As illustrated in FIGS. 2 and 9, the IC package assembly 50 is formed into a bar shape linearly extending in the directions A shown in the figures. Further, as illustrated in FIGS. 2, 3, and 5, the IC package assembly 50 is accommodated in the recess 27 formed in the substrate 25.

The burn-in board 22 illustrated in FIG. 2 has four recesses 27 each capable of accommodating the IC package assembly 50 (refer to FIG. 4). As illustrated in FIG. 5, the connectors 53 of the IC package assembly 50 accommodated in the recess 27 contacts leading ends of the upper spiral contacts 33 provided on the upper sheet 30 of the coupling member 29. Thereby, the connectors 53 are in conductive contact with the upper spiral contacts 33.

As illustrated in FIG. 3, the cover 28 is attached to one of opposite ends of the substrate 25 to be rotatably supported by a hinge 60. As illustrated in FIG. 3, the other end of the substrate 25 is formed with a locked portion 25a, while a corresponding end of the cover 28 is formed with a locking portion 28a. If the cover 28 is closed with the individual IC package assemblies 50 being accommodated in the recesses 27, and if the locking portion 28a of the cover 28 is locked in the locked portion 25a of the substrate 25, the individual IC package assembly 50 is pressed toward the mounting surface 27a (i.e., in a downward direction in the figure) by a pressing portion 28b provided on a ceiling surface of the cover 28. As a result, the connectors 53 press the upper spiral contacts 33 down toward the mounting surface 27a (i.e., in the downward direction in the figure). At the same time, the lower spiral contacts 34 are also pressed down toward the mounting surface 27a (i.e., in the downward direction in the figure). In this process, the elastic deforming portion 33b of the individual upper spiral contact 33 is deformed to be spread out from its spiral center toward the outside. Thus, the elastic deforming portion 33b winds around to wrap an outer surface of the corresponding connector 53. Therefore, each of the connectors 53 is securely in conductive contact with and connected to the corresponding upper spiral contact 33.

After the IC package assembly 50 is set as illustrated in FIG. 5, the burn-in test is performed. The burn-in test is roughly divided into a so-called preliminary test (i.e., a pre-burn-in test) and a main test (i.e., a main burn-in test). In the preliminary test, the IC package assemblies 50 are exposed to an environment of a temperature of approximately 90° C. for several tens of seconds. Meanwhile, in the main test, the IC package assemblies 50 are exposed to a high-temperature environment of a temperature in a range of from approximately 125° C. to approximately 150° C. for approximately 48 hours.

For example, if an IC package 51 includes internal wiring a part of which has an abnormal resistance value, and if the IC package 51 is directly sent for the main test without being subjected to the preliminary test, the abnormal part of the IC package 51 may generate heat, and at worst, the burn-in board 22 may catch fire.

In view of the above, if an abnormality is found in the internal wiring of an IC package 51, a part of the internal wiring of the IC package 51 having an abnormal resistance value is burned off. Thus, the burn-in board 22 is prevented from catching fire.

In the main test, quality of the IC packages 51 are determined by externally sending electrical signals to the IC packages 51 on the burn-in board 22. In this main test, an unusable IC package 51 having a defect such as a cut in wirings 54a of the electronic function devices 54 is distinguished from a nondefective IC package 51.

As described above, in the burn-in board 22 according to the present embodiment which forms the burn-in test apparatus 20, the coupling member 29 is replaceably provided with respect to the substrate 25.

As described above with reference to FIGS. 12 to 15, the coupling member 29 has the base plate 32 which has the upper surface and the lower surface provided with the multitude of the upper spiral contacts 33 and the lower spiral contacts 34, respectively. Further, the upper spiral contacts 33 and the lower spiral contacts 34 include the spiral-shaped elastic deforming portions 33b and 34b, respectively. The upper and lower spiral contacts 33 and 34 are formed by a thin film technique, such as the plating technique and the electrocasting technique, for example. Therefore, the elastic deforming portions 33b and 34b are elastically deformed easily with low contact pressure.

With this configuration including the upper spiral contacts 33 having the elastic deforming portions 33b as the terminals for the connectors 53, the contact pressure on the connectors 53 can be reduced, compared with a conventional art including the contact pins. Therefore, the contact pressure can be applied more evenly to the multitude of the connectors 53, which protrude from a large area of the lower surface of the IC package assembly 50 extending in the width direction (i.e., the directions A in shown in the figures), so that the connectors 53 contact the upper spiral contacts 33 with the more evenly applied contact pressure. As a result, the conductive contact and connection are secured between the upper spiral contacts 33 and connectors 53. Further, the lower spiral contacts 34 having the elastic deforming portions 34b are provided as the lower terminals contacting the electrodes 26 of the substrate 25, and thus the contact pressure on the connectors 53 can be further reduced. Therefore, in addition to the secured conductive contact and connection between the upper spiral contacts 33 and the connectors 53, conductive contact and connection can be secured also between the lower spiral contacts 34 and the electrodes 26 due to elastic deformation of the lower elastic deforming portions 34. Furthermore, due to the reduced contact pressure, the connectors 53 of the IC package 51 are prevented from being damaged by contact with the upper spiral contacts 33. Also, since the contact pressure is likely to be evenly applied to the individual connectors 53, the burn-in test can be performed more appropriately and accurately than previously.

Further, according to the present embodiment, the coupling members 29 are positioned on and attached to the mounting surface 27a by the screws 45. Therefore, if the screws 45 are removed, the coupling members 29 can be easily replaced. For example, if it is found in a periodic maintenance check that the upper and lower spiral contacts 33 and 34 forming one of the coupling members 29 have become defective due to plastic deformation but the substrate 25 has no problem, only the coupling member 29 can be easily replaced. As a result, the maintenance fee can be reduced.

The positioning of each of the coupling members 29 by the screws 45 and the through holes 39 is preferable, since the coupling member 29 can be accurately positioned on the substrate 25 with a simple mechanism. Further, a positioning portion, which includes the communicating portion connecting the front surface and the back surface of the coupling member 29 and the piercing member piercing through the communicating portion, can be provided in a small space. Thus, the burn-in board 22 can be downsized. Furthermore, the positioning portion including the screw 45 and the through hole 39 also serves as a fixing portion (i.e., a fixing device) for fixing each of the coupling members 29 onto the substrate 25. Since the contact pressure of the upper spiral contacts 33 and the contact pressure of the lower spiral contacts 34 are both small, each of the coupling members 29 can be easily fixed on the substrate 25. Alternatively, the coupling members 29 may be positioned by a combination of a cutout communicating portion and a piercing member piercing through the cutout communicating portion.

Further, in the burn-in board 22 according to the present embodiment which forms the burn-in test apparatus 20, the recesses 27 are provided for accommodating the IC package assemblies 50 each of which is formed into a bar shape, for example, prior to separation of the IC package assemblies 50 into the individual IC packages 51. Thus, each of the IC packages 51 can be pressed together by the pressing portions 28b, with the IC package assemblies 50 being accommodated in the corresponding recesses 27. Accordingly, all of the IC packages 51 can be easily pressed, and the pressing force is likely to be evenly applied to the individual IC packages 51. Furthermore, according to the present embodiment, the plurality of the IC packages 51 included in each of the IC package assemblies 50 are subjected to the burn-in test at one time. In the present embodiment, therefore, the burn-in test can be performed on a larger number of the IC packages 51 at one time, as compared with the conventional art. Accordingly, efficiency of the burn-in test can be increased.

The present embodiment may be modified into another embodiment in which separate recesses are provided for accommodating the individually separated IC packages 51 and in which the individual recess includes a coupling member basically similar in structure to the structure of the coupling member 29 shown in FIGS. 12 and 14. With this configuration, the test can be preformed with the IC packages 51 being accommodated in the respective recesses. The contact pressure to the connectors 53 of the IC package 51 can be reduced also in this case. Further, since the coupling member is replaceably positioned with respect to the substrate 25, the coupling member can be easily replaced when its replacement is desired, as in the maintenance check or the like.

In another embodiment shown in FIGS. 6 to 8, the coupling member 29 is not fixed in the recess 27 of the substrate 25. As illustrated in FIGS. 6 to 8, unlike the example shown in FIG. 2, the coupling member 29 is not fixed on the substrate 25 by the screws. As illustrated in FIG. 8, a cylindrical convex portion (i.e., a piercing member) 42 is provided to protrude upward from the bottom surface (i.e., the mounting surface) 27a of the recess 27 in the substrate 25. As illustrated in FIG. 6, the individual coupling member 29 is provided with two convex portions 42, which are placed at positions facing the opposite ends of the coupling member 29 in its width direction (i.e., the directions A shown in the figure). Meanwhile, the opposite ends of the coupling member 29 are formed with the through holes (i.e., the communicating portions) 39 at positions facing the convex portions 42. The convex portions 42 are inserted in the through holes 39, and the coupling member 29 is positioned with respect to the substrate 25. Concavo-convex engagement between the convex portions 42 and the through holes 39 is not for fixing the coupling member 29 in the recess 27 of the substrate 25, unlike the screws or the like.

However, to prevent the coupling member 29 from escaping from the recess 27 of the substrate 25 when the burn-in board 22 receives a jolt or the like prior to placement of the IC package assembly (i.e., the test object assembly) 50 on the burn-in board 22, for example, projections 43 are preferably provided on side walls of the recess 27 for preventing such escape of the coupling member 29, as illustrated in FIGS. 6 and 7. The projection 43 is not limited to any particular shape, as long as the projection 43 can prevent the escape of the coupling member 29 from the recess 27. Further, the projection 43 may be formed integrally with or separately from the substrate 25. Furthermore, the projection 43 may make installing of the coupling member 29 in the recess 27 difficult, and thus the protrusion 43 may be formed of an elastic material capable of being elastically deformed, such as a rubber, for example. Also, the protrusion 43 preferably has a protruded and curved (e.g., semielliptic or hemispheric) surface with smooth texture.

Further, the coupling member 29 is preferably provided with holding spaces 44 for easy removal of the coupling member 29 from the recess 27. The holding space 44 shown in FIG. 6 is a cutout. However, the holding space 44 is not limited to the cutout shape. Further, a claw-shaped tool or a special jig can be engaged in the holding space 44 to easily remove the coupling member 29 from the recess 27. The holding spaces 44 are preferably provided to the coupling member 29 placed in burn-in boards according to other embodiments than the burn-in board shown in FIG. 6.

As illustrated in FIG. 7, when the IC package assembly 50 is placed on the coupling member 29 and then the cover 28 is closed, the pressing portion 28b provided on the ceiling surface of the cover 28 presses down the IC package assembly 50. Then, the elastic deforming portions 33b of the upper spiral contacts 33 and the elastic deforming portions 34b of the lower spiral contacts 34 are elastically deformed by the pressing force. Thereby, conductive contact and connection are secured between the electrodes 26 of the substrate 25 and the lower spiral contacts 34 and also between the connectors 53 of the IC package assembly 51 and the upper spiral contacts 33. In this case, even if the coupling member 29 is not practically fixed to the substrate 25, the coupling member 29 is sandwiched and held with pressing forces by the IC package assembly 50 and the substrate 25 (i.e., the coupling member 29 applies elastic repulsive forces to the connectors 53 and the electrodes 26) in a state in which the IC package assembly 50 is set in the recess 27. Further, the coupling member 29 is positioned by the convex portions 42 and the through holes 39. The above configuration prevents, in particular during the test, such phenomena as misalignment of the coupling member 29 within the recess 27 and disconnection of the conductive contact between the upper and lower spiral contacts 33 and 34, the connectors 53, and the electrodes 26.

Accordingly, the coupling member 29 can be provided on the substrate 25 without being fixed thereon. As a result, the coupling member 29 can be easily set on the substrate 25 and easily detached for replacement from the substrate 25.

Figure 16:
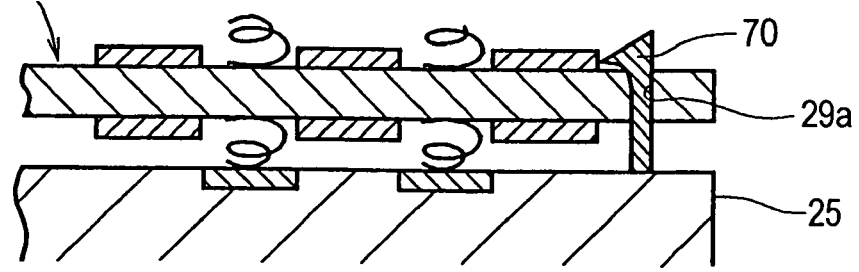
FIG. 16 is a partial cross-sectional view of a substrate and the coupling member for illustrating a configuration in which the coupling member is attached to the substrate by a different technique from the technique used in the example shown in FIG. 5.
Figure 17:
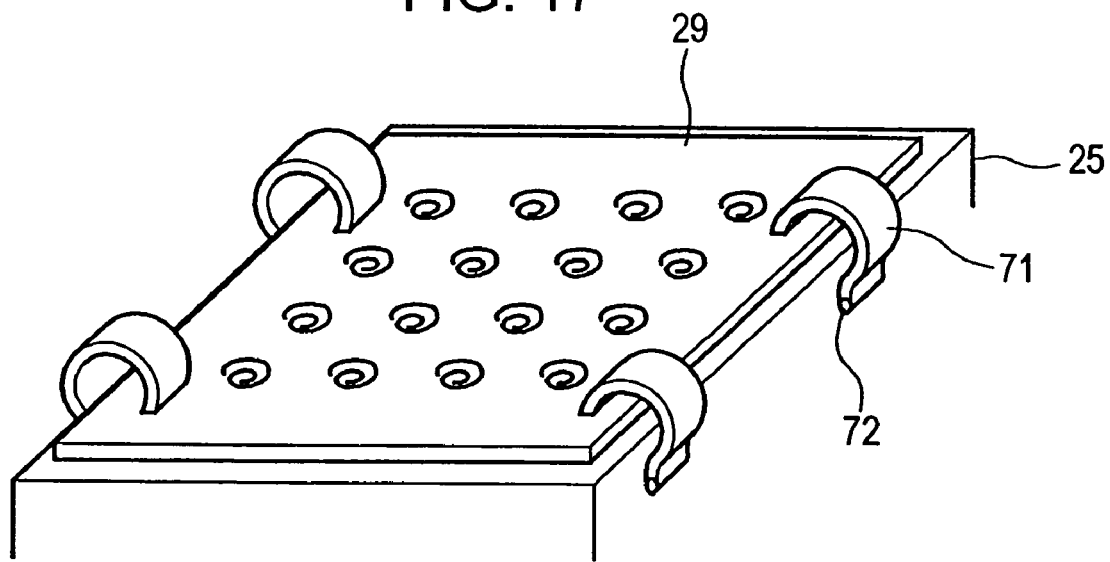
FIG. 17 is a partial perspective view of the substrate and the coupling member for illustrating another configuration in which the coupling member is attached to the substrate by another different technique from the technique used in the example shown in FIG. 5.

In replacement of the screw 45 shown in FIG. 5, a boss 70 shown in FIG. 16 which protrudes upward from the upper surface of the substrate 25, a clip 71 shown in FIG. 17, or the like, for example, may be used to fix the coupling member 29 on the substrate 25. As illustrated in FIG. 16, the coupling member 29 is formed with a through hole 29a at a position facing the boss 70. The boss 70 is inserted through the through hole 29a so that the coupling member 29 is attached to the substrate 25. By aligning the boss 70 with the through hole 29a, the coupling member 29 can be placed at a predetermined position on the substrate 25 and also can be fixed thereon. Alternatively, as illustrated in FIG. 17, a plurality of the clips 71 may be rotatably attached to side surfaces of the substrate 25 via hinges 72. Spring members (not illustrated) provided to the hinges 72 apply biasing forces to the coupling member 29 placed on the substrate 25 for pressing the coupling member 29 on the substrate 25. Thereby, the coupling member 29 is fixed on the substrate 25. However, the coupling member 29 cannot be appropriately positioned on the substrate 25 only by the clips 71. Therefore, the positioning portion of the concavo-convex structure described above with reference to FIG. 8, which includes the convex portion 42 and the through hole 39, needs to be provided separately from the clips 71.

The cover described above with reference to FIG. 3 is provided for the individual substrate 25, for example, and the lower surface of the cover 28 is provided with the pressing portions 28b separately formed by the number of the corresponding recesses 27 at positions facing the recesses 27. The IC package assembly 50 accommodated in the individual recess 27 is pressed downward (i.e., a direction toward the mounting surface 27a) by the corresponding pressing portion 28b. Thereby, the connectors 53 are appropriately in conductive contact with and connected to the upper spiral contacts 33. Alternatively, the cover 28 may be provided by the number of the recesses 27 formed on the substrate 25 so that the respective covers 28 cover the corresponding recesses 27.

Figure 18:
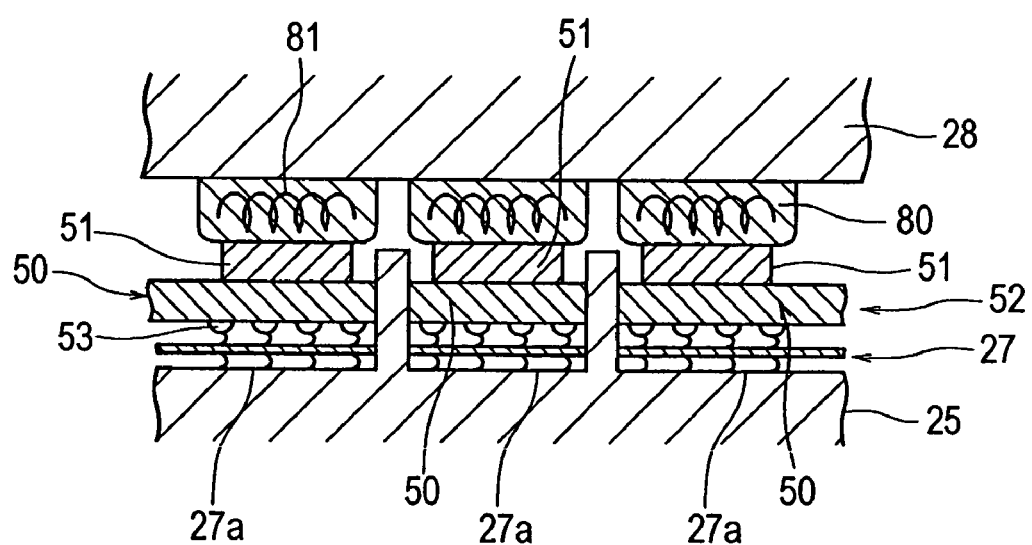
FIG. 18 is a partial cross-sectional view of the burn-in board shown in FIG. 19 cut along the line XVIII-XVIII, as viewed in the direction of arrows placed near the line.
Figure 19:
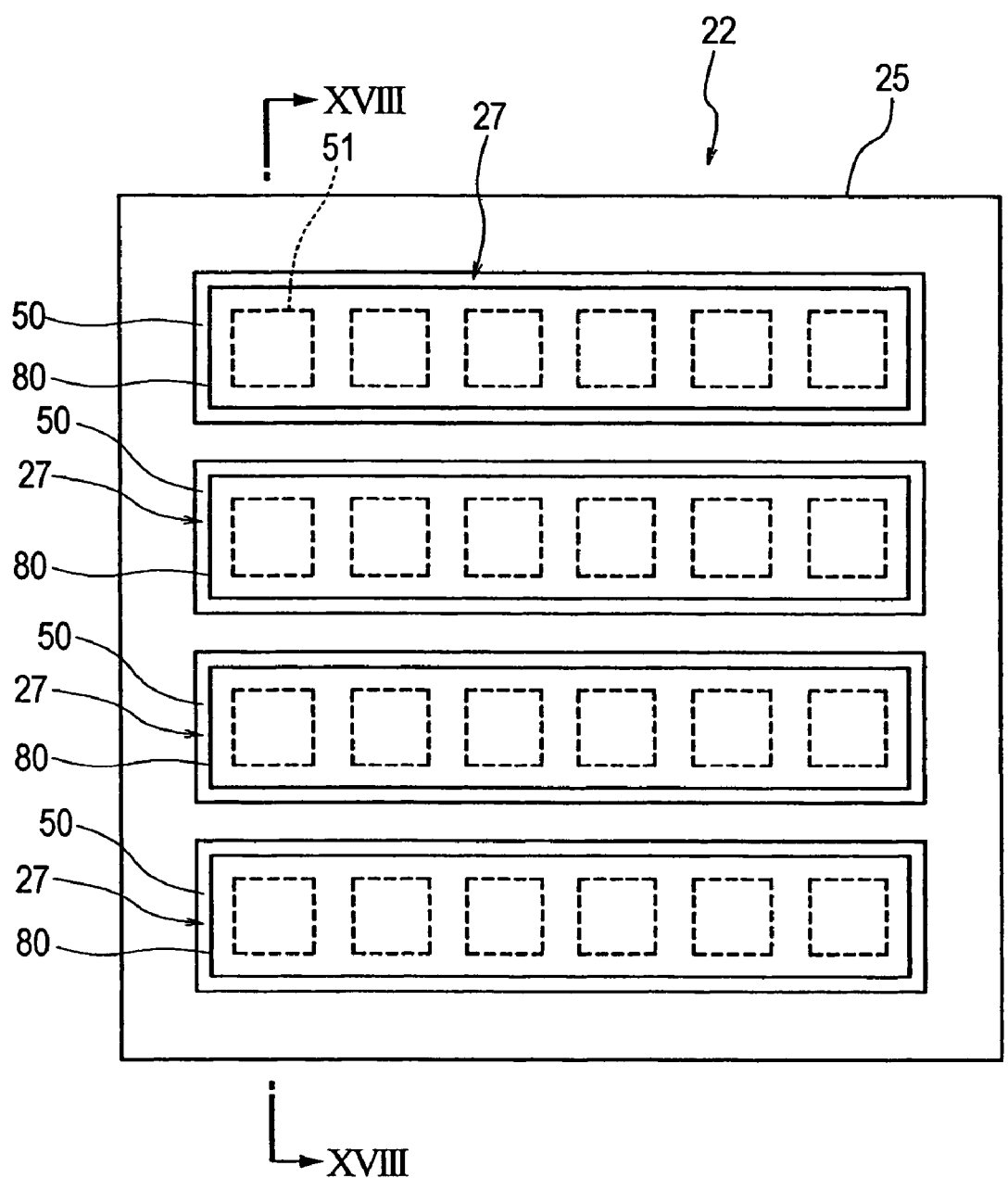
FIG. 19 is a partial plan view of a burn-in board according to another embodiment of the present invention.

FIG. 18 is a partial cross-sectional view of a burn-in board 22 shown in FIG. 19, which is cut along the line XVIII-XVIII and is viewed in the direction of arrows placed near the line. The substrate 25 shown in FIGS. 18 and 19 is the same in structure as the substrate 25 described above with reference to FIGS. 3 and 5. As illustrated in FIG. 18, the cover 28 is provided with pressing portions 80 by the number of the plural IC package assemblies 50 accommodated in the recesses 27 so that the respective pressing portions 80 press the corresponding IC package assemblies 50 from their upper surfaces toward the mounting surfaces 27a. As illustrated in FIG. 18, the individual pressing portion 80 includes a heating device (i.e., a temperature adjusting device) 81 so that heating is performed by the heating device 81 for the individual IC package assembly 50. Thus, the burn-in test can be performed under different heating conditions for the different IC package assemblies 50. For example, if the electronic function devices 54 included in the multitude of the IC packages 51 are different in type between the IC package assemblies 50, and if the heating condition is desired to be changed between an IC package assembly 50 and another IC package assembly 50, the configuration shown in FIGS. 18 and 19 is effective. Further, a cooling device may be provided in the individual pressing portion 80 in replacement of the heating device 81.

Figure 20:
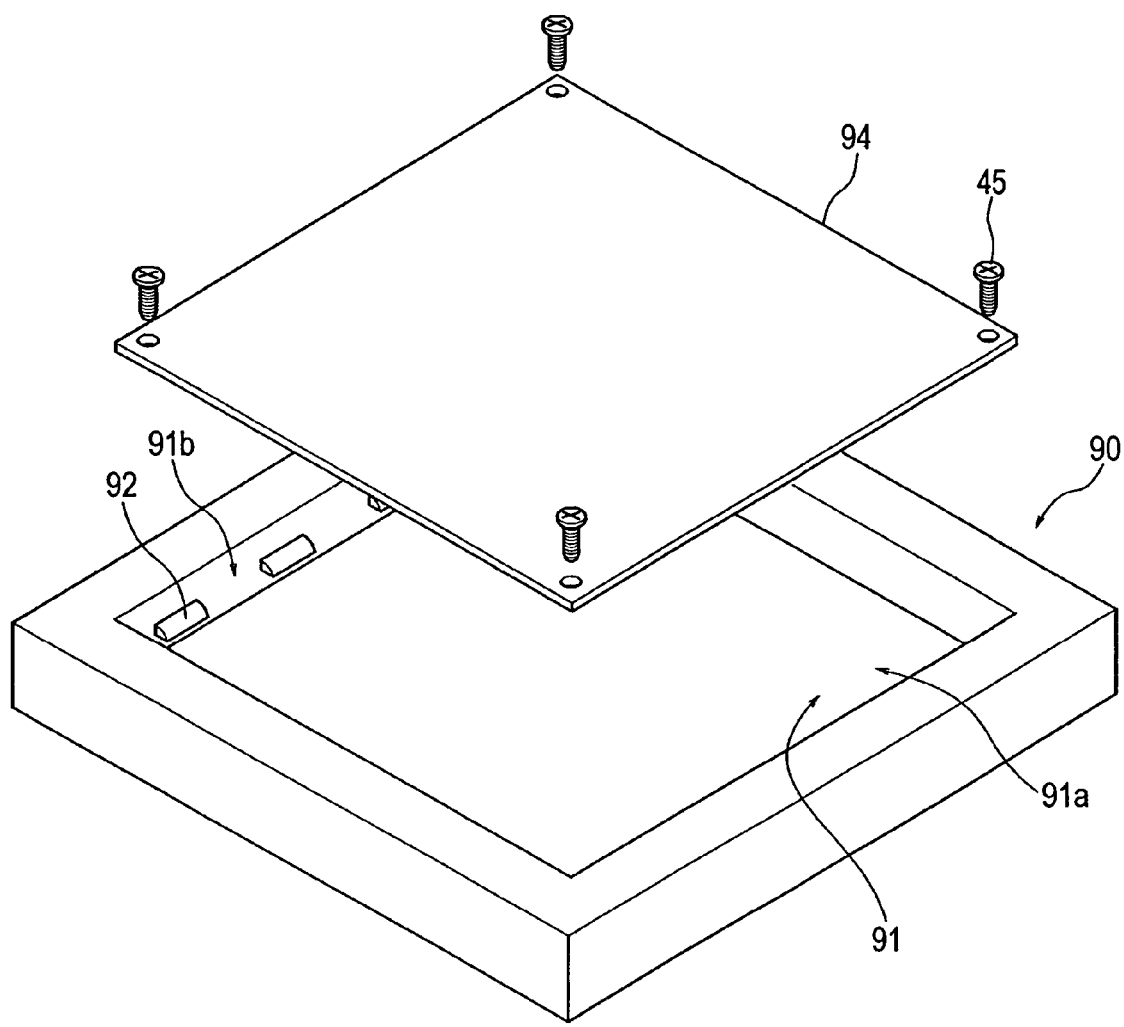
FIG. 20 is a partial perspective view of a burn-in board according to another embodiment of the present invention.

In a burn-in board 90 shown in FIG. 20, a recess 91 is provided for accommodating a multitude of the IC package assemblies 50. That is, while the burn-in board 22 shown in FIG. 2 has the plurality of the recesses 27 each accommodating one IC package assembly 50, the burn-in board 90 shown in FIG. 20 includes the single large recess 91 for accommodating the multitude of the IC package assemblies 50. In FIG. 20, a bottom surface 91a of the recess 91 forms a mounting surface on which the multitude of the IC package assemblies 50 are placed. The multitude of the electrodes 26 described above with reference to FIG. 5 are exposed on the bottom surface 91a. As illustrated in FIG. 20, a coupling member 94 as large as or slightly smaller than the recess 91 is provided. The coupling member 94 is positioned and fixed over the mounting surface 91a by the screws 45. The coupling member 94 may not be fixed, and thus only the positioning portion of the concavo-convex structure including the convex portion 42 and the through hole 39, which is described above with reference to FIG. 8, may be provided.

Figure 22:
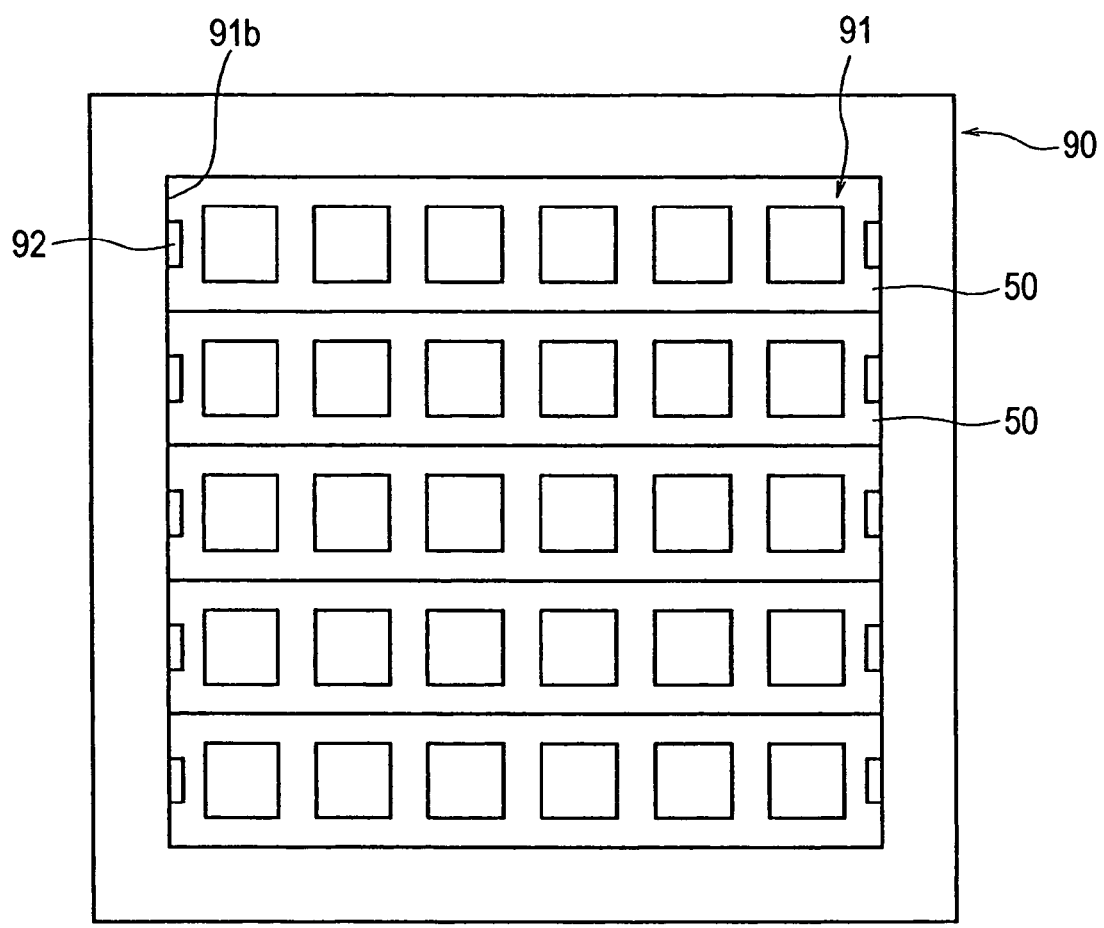
FIG. 22 is a partial plan view of the burn-in board shown in either one of FIGS. 20 and 21 which accommodates test object assemblies.

As illustrated in FIG. 20, a multitude of locking portions 92 protrude from inner side walls 91b of the recess 91. As illustrated in FIG. 22, a plurality of the locking portions 92 are provided on at least a pair of the opposite inner side walls 91b which face each other, at least for temporarily holding the IC package assemblies 50 accommodated in the recess 91 before the cover 28 shown in FIG. 3 is closed so that the IC package assemblies 50 will not be misaligned. Alternatively, the cover 28 may not be provided, and the IC package assemblies 50 may be held in the recess 91 only by the locking portions 92. In this case, the locking portions 92 preferably have biasing force for pressing the IC package assemblies 50 accommodated in the recess 91 toward the mounting surface 91a.

Figure 21:
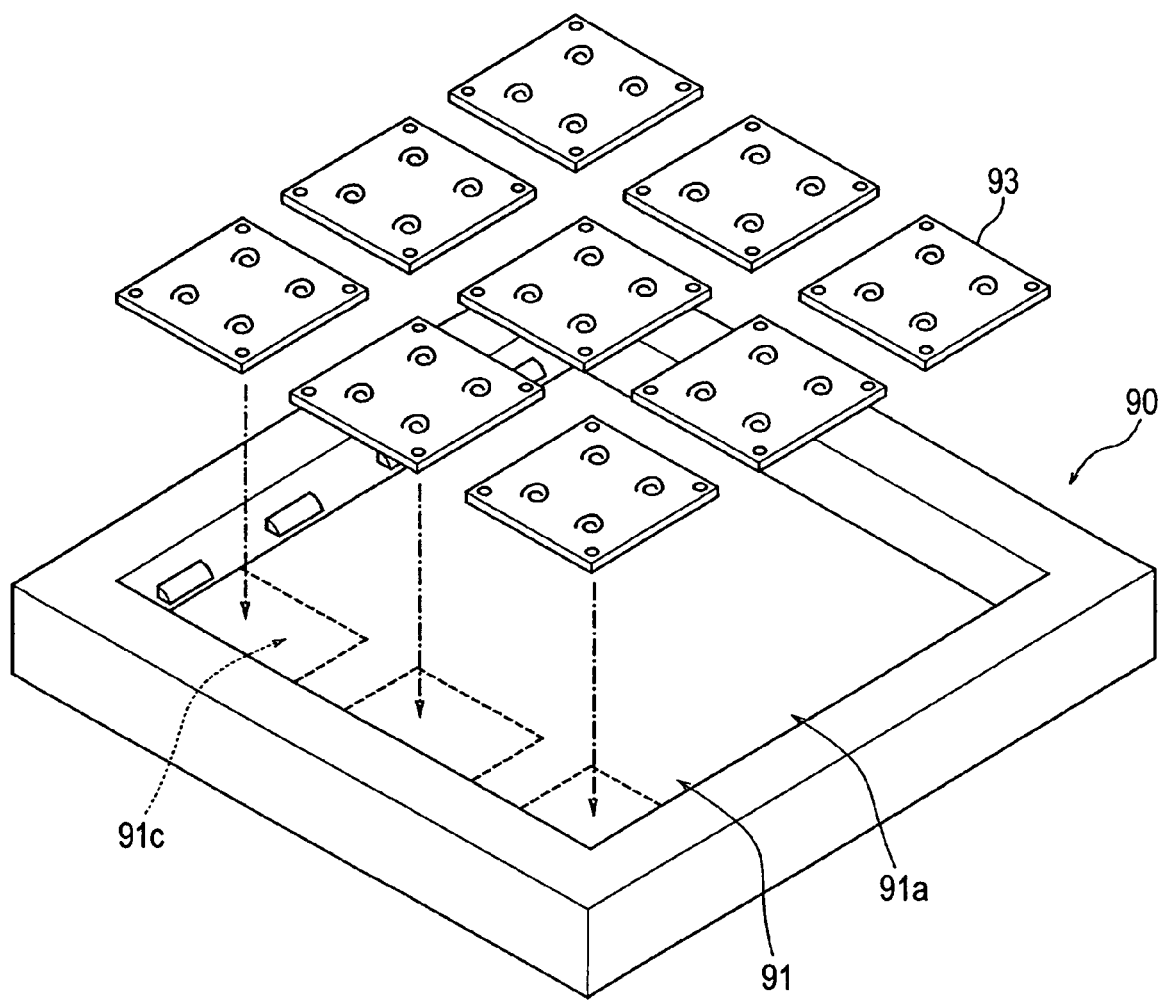
FIG. 21 is a partial perspective view of a burn-in board according to another embodiment of the present invention.

An example shown in FIG. 21 is different from the example shown in FIG. 20 in the structure of the coupling member. In the example shown in FIG. 20, the one single coupling member 94 is provided in the recess 91. Meanwhile, in the example shown in FIG. 21, a plurality of divided coupling members 93 are provided in the recess 91. As illustrated in FIG. 21, the mounting surface 91a of the recess 91 is demarcated into a plurality of regions 91c. As illustrated in FIG. 21, the regions 91c are set at predetermined intervals. Alternatively, the respective regions 91c may be set without such intervals.

As illustrated in FIG. 21, the individual coupling member 93 is placed on the corresponding region 91c. The coupling member 93 is positioned and set on the mounting surface 93a. The coupling member 93 is not particularly different in structure from the coupling member 29 described above with reference to FIGS. 12 to 15. As illustrated in FIG. 21, the plurality of the coupling members 93 are provided in the plurality of demarcated regions 91c within the recess 91. Thus, in the maintenance check, for example, only a coupling member 93 determined defective can be replaced instead of replacing all of the coupling members 93. Therefore, the maintenance fee can be reduced. Also in the configuration in which the plurality of the recesses 27 are formed on the substrate 25, as illustrated in FIG. 2, the coupling member set in the individual recess 27 may be divided into a plurality of the coupling members so that the plurality of the coupling members are set in the individual recess 27.

Figure 23:
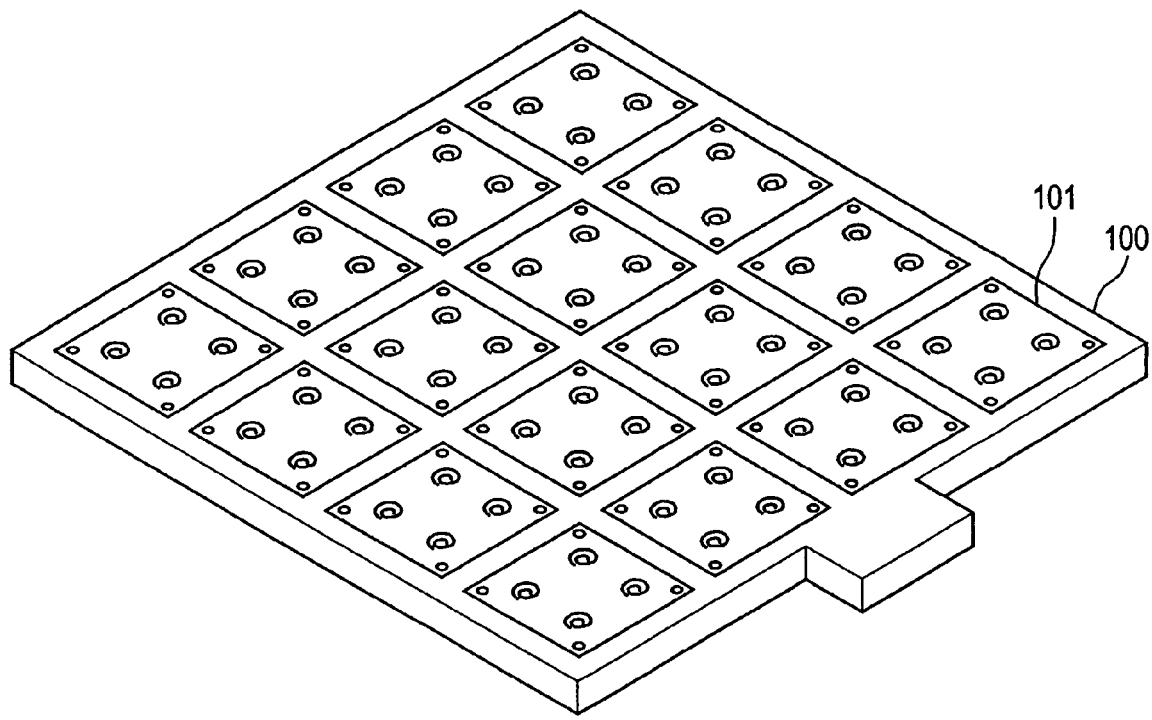
FIG. 23 is a partial perspective view of a burn-in board according to another embodiment of the present invention.

In an example shown in FIG. 23, a plurality of coupling members 101 are provided on a substrate 100 which is formed by layering a multitude of printed wiring boards (PWBs). In the example of FIG. 23, the substrate 100 is not provided with the recess 91 for accommodating the plurality of the IC package assemblies 50 shown in FIG. 18. Therefore, for example, a frame having a recess may be separately provided so that the substrate 100 shown in FIG. 23 is set in the frame.

Figure 24:
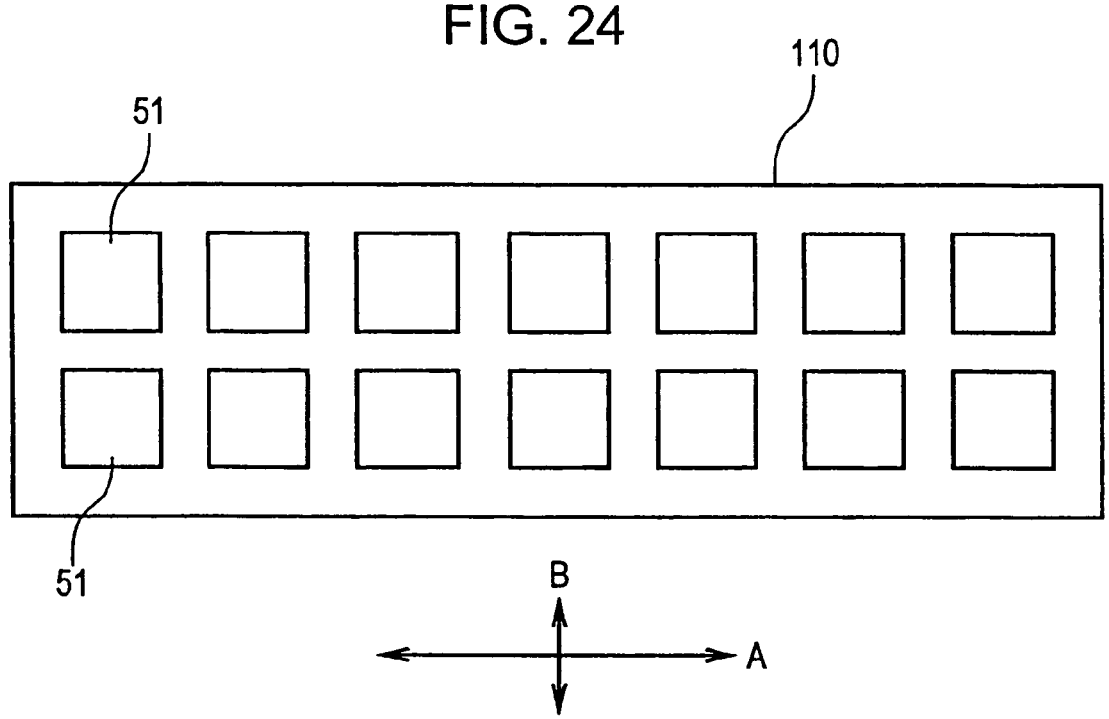
FIG. 24 is a partial plan view of an electric component assembly according to another embodiment of the present invention.
Figure 25:
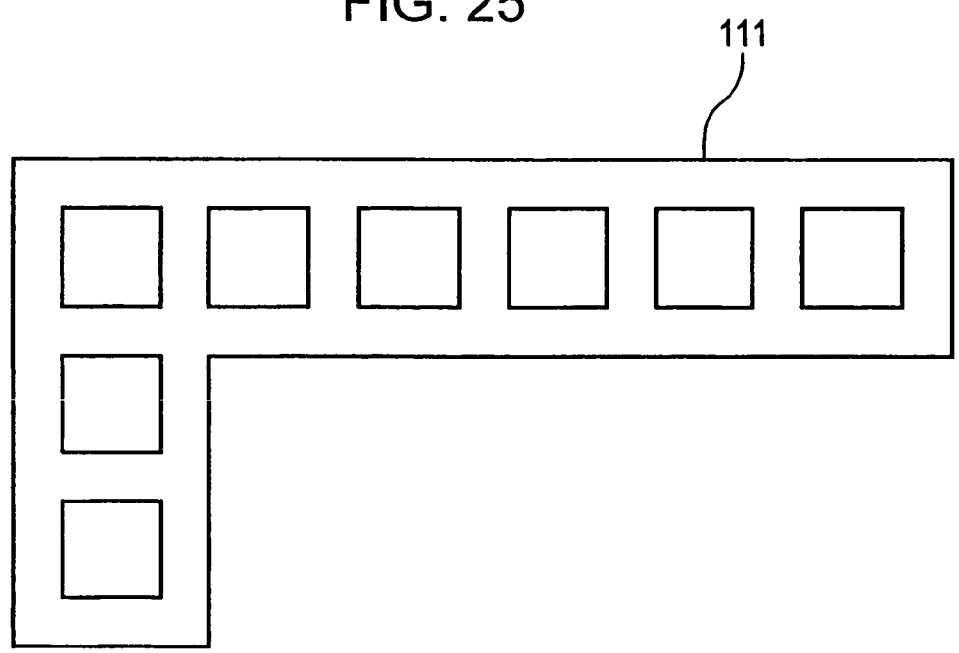
FIG. 25 is a partial plan view of an electric component assembly according to another embodiment of the present invention.
Figure 26:
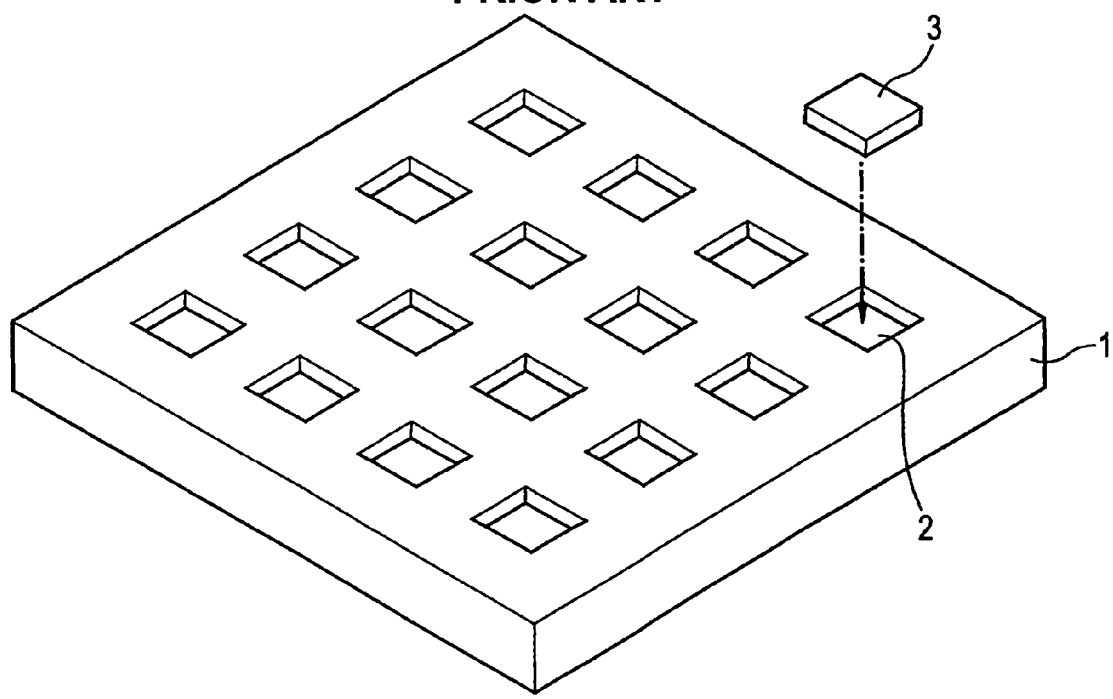
FIG. 26 is a partial perspective view of a conventional burn-in board.
Figure 27:
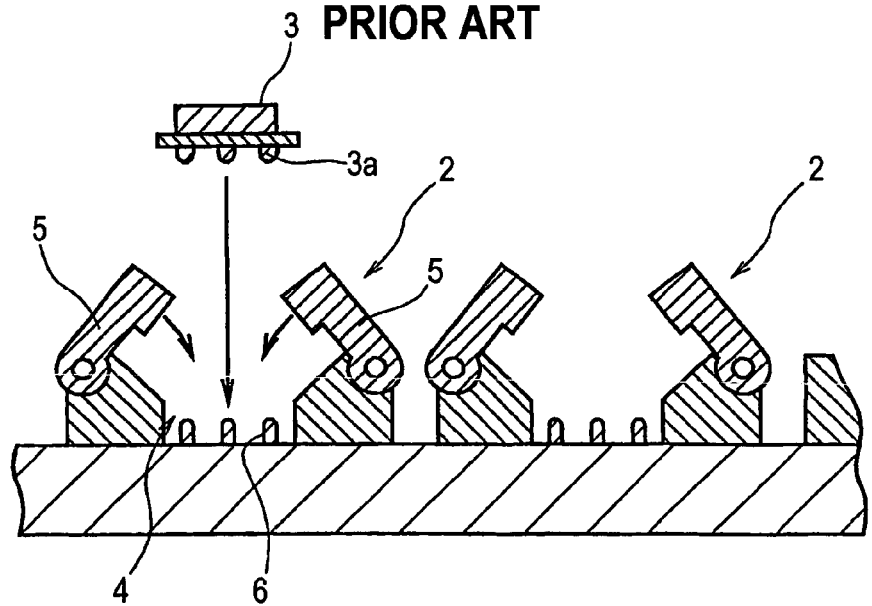
FIG. 27 is a partial cross-sectional view of the conventional burn-in board.

FIGS. 24 and 25 illustrate planar shapes of IC package assemblies 110 and 111, respectively, which are different from the planar shape of the IC package assembly 50 described above with reference to FIG. 9. The IC package assembly 110 shown in FIG. 24 includes two rows of the IC packages 51. In each of the two rows, the IC packages 51 are arranged in the direction of X shown in the figure, and the two rows are arranged alongside in the directions B shown in the figure. Meanwhile, the IC package assembly 111 shown in FIG. 25 is formed into an approximately L-shaped planar shape. In this way, in the embodiments of the present invention, the IC package assembly is not limited to any particular planar shape, and thus IC package assemblies of any shapes can be tested.

As for a method of performing the burn-in test, as described above, the burn-in test is performed after the IC package assembly 50 is set in the recess 27 as illustrated in FIG. 5. In the present embodiment, the upper side and the lower side of the coupling member 29 are provided with the upper spiral contacts 33 including the elastic deforming portions 33b and the lower spiral contacts 34 including the elastic deforming portions 34b, respectively. The upper and lower spiral contacts 33 and 34 are formed by the thin film technique, such as the plating technique and the electrocasting technique, for example, and thus are elastically deformed easily with low contact pressure. Therefore, in the method of performing the burn-in test according to the present embodiment, the connectors 53 of the IC package 51 can be made contact with the upper spiral contacts 33 with the low contact pressure. Therefore, the connectors 53 are not damaged by contact with the upper spiral contacts 33. Further, the contact pressure tends to be evenly applied to the respective connectors 53. Accordingly, the burn-in test can be performed more appropriately and accurately, compared with the conventional art.

Further, according to the present embodiment, the plurality of the IC packages included in the IC package 50 can be subjected to the burn-in test at one time. Accordingly, the burn-in test can be performed on a larger number of the IC packages 51 at one time, compared with the conventional art.

If a defective IC package 51 having a cut or the like in the wiring 54a of its IC chip (i.e., the electronic function device) 54 is found as a result of the burn-in test, marking is preferably performed on the defective IC package 51. The marking may be performed by using laser, for example. Therefore, the burn-in test apparatus 20 preferably includes a laser unit. Further, the burn-in test apparatus 20 preferably includes a memory unit for storing data of the marked IC package 51 so that, when the IC package assembly 50 is sent to a subsequent test process, the defective IC package 51 which needs not be subjected to the subsequent test process can be accurately distinguished. As illustrated in FIG. 10, after the burn-in test is performed, the IC packages 51 are manufactured in a process in which the IC package assembly 50 is cut into the individual IC packages 51. In this process, if the marked IC package 51 included in the individually separated IC packages 51 is disposed, for example, only nondefective IC packages 51 can be sent to the subsequent test process. Further, only the nondefective IC packages 51 can be shipped. Alternatively, the marking operation may be performed on the nondefective IC packages 51.

The test apparatus according to the present embodiment is not limited to particularly limited to the burn-in test apparatus, and thus can be applied to a test apparatus used in an operation test (i.e., a final test) performed subsequent to the burn-in test, for example.

The upper and lower spiral contacts 33 and 34 provided on the coupling member 29 are not limited to the spiral shape. However, the upper and lower spiral contacts 33 and 34 are preferably formed into the spiral shape for its ability to secure conductive contact between the upper spiral contacts 33 and the connectors 53 irrespective of the shape of the connectors 53.

Further, the cross-section of the upper and lower spiral contacts 33 and 34 is not limited to the cross-section shown in FIG. 15. For example, the conductive layer 40 may be layered only on the upper surface of the supplemental elastic layer 41 or only under the lower surface of the supplemental elastic layer 41. Further, the upper and lower spiral contacts 33 and 34 may have a single layer structure or a three or more layer structure.

What is claimed is:

1. A test apparatus comprising:
   a coupling member including a base plate, terminals provided on a front surface and a back surface of the base plate and having elastic deforming portions, and conducting portions each formed between the elastic deforming portions in the base plate for providing conductive contact between the terminals on the front surface and the terminals on the back surface;
   a substrate formed with recesses arranged in a column, each of the recesses accommodating a test object and the coupling member;
   a plurality of electrodes provided on a bottom surface of the recess;
   a positioning portion for replaceably positioning the coupling member with respect to the substrate while keeping the elastic deforming portions on the back surface of the base plate in contact with the plurality of electrodes; and
   a pressing portion for pressing the test object set in the recess against the coupling member while keeping electrodes of the test object in contact with the terminals on the front surface of the coupling member,
   wherein the recess is capable of accommodating a test object assembly including a plurality of the test objects connected with one another; and the recesses are capable of accommodating a plurality of the test object assemblies.

2. The test apparatus according to claim 1,
   wherein the positioning portion includes: a communicating portion formed in the coupling member for enabling the front surface and the back surface of the coupling member to communicate with each other; and a piercing member for piercing through the communicating portion.

3. The test apparatus according to claim 2,
   wherein the piercing member is provided on the substrate, and
   wherein the coupling member is positioned and placed on the substrate, with the piercing member piercing through the communicating portion.

4. The test apparatus according to claim 3,
   wherein the substrate includes a retaining portion for preventing the coupling member from escaping from the recess.

5. The test apparatus according to claim 1,
   wherein the coupling member is positioned with respect to the substrate and fixed thereon by a screw.

6. The test apparatus according to claim 1,
   wherein the coupling member includes a holding space used in removing the coupling member from the recess.

7. The test apparatus according to claim 1,
   wherein the elastic deforming portions are formed three-dimensionally to extend in a direction away from the base plate.

* * * * *